United States Patent
Pantelidis et al.

(10) Patent No.: US 12,316,936 B2
(45) Date of Patent: May 27, 2025

(54) ACTUATOR ASSEMBLY

(71) Applicant: CAMBRIDGE MECHATRONICS LIMITED, Cambridge (GB)

(72) Inventors: Konstantinos Pantelidis, Cambridge (GB); Adam South, Cambridge (GB); Andrew Benjamin Simpson Brown, Cambridge (GB); James Howarth, Cambridge (GB); Robin Eddington, Cambridge (GB); Paul Windle, Cambridge (GB); Andreas Flouris, Cambridge (GB)

(73) Assignee: CAMBRIDGE MECHATRONICS LIMITED, Cambridge (GB)

( * ) Notice: Subject to any disclaimer, the term of this patent is extended or adjusted under 35 U.S.C. 154(b) by 156 days.

(21) Appl. No.: 18/023,818

(22) PCT Filed: Aug. 31, 2021

(86) PCT No.: PCT/GB2021/052252
§ 371 (c)(1),
(2) Date: Feb. 28, 2023

(87) PCT Pub. No.: WO2022/043717
PCT Pub. Date: Mar. 3, 2022

(65) Prior Publication Data
US 2023/0328348 A1 Oct. 12, 2023

(30) Foreign Application Priority Data

Aug. 31, 2020 (GB) ........................ 2013658
Sep. 29, 2020 (GB) ........................ 2015412
(Continued)

(51) Int. Cl.
*H04N 23/54* (2023.01)
*H04N 23/55* (2023.01)
(Continued)

(52) U.S. Cl.
CPC ............. *H04N 23/54* (2023.01); *H04N 23/55* (2023.01); *H04N 23/687* (2023.01);
(Continued)

(58) Field of Classification Search
CPC ...... H04N 23/54; H04N 23/55; H04N 23/687; H04N 23/67; H04N 23/68; H04N 23/57;
(Continued)

(56) References Cited

U.S. PATENT DOCUMENTS

2006/0192277 A1 8/2006 Raghuram
2014/0354900 A1* 12/2014 Qian ................... H05K 1/028
174/254

(Continued)

FOREIGN PATENT DOCUMENTS

CN 210381054 U * 4/2020 ............... G02B 7/04
WO 2015045792 A1 4/2015

OTHER PUBLICATIONS

GB Search and Examination Report of GB Application No. GB2013658.6 dated Feb. 25, 2021.
(Continued)

*Primary Examiner* — Nhan T Tran
(74) *Attorney, Agent, or Firm* — Van Hoven PC; Stefan D. Osterbur; Joshua Van Hoven

(57) ABSTRACT

An actuator assembly comprising: a support structure; an image sensor assembly comprising an image sensor having a light-sensitive region, the image sensor assembly being suspended on the support structure in a manner allowing movement of the image sensor assembly relative to the support structure; and at least two flexible printed circuits, each electrically connected at one end to the image sensor assembly, wherein the flexible printed circuits fold around the image sensor assembly such that their other ends are at the same side of the image sensor assembly.

20 Claims, 25 Drawing Sheets

(30) Foreign Application Priority Data

Nov. 11, 2020 (GB) ........................................ 2017761
Jul. 28, 2021 (GB) ........................................ 2110839

(51) Int. Cl.
  *H04N 23/68* (2023.01)
  *H05K 1/14* (2006.01)
  *G03B 13/36* (2021.01)

(52) U.S. Cl.
  CPC .............. *H05K 1/147* (2013.01); *G03B 13/36* (2013.01); *H05K 2201/10121* (2013.01); *H05K 2201/10151* (2013.01)

(58) Field of Classification Search
  CPC ......... H05K 1/147; H05K 2201/10121; H05K 2201/10151; G03B 13/36
  See application file for complete search history.

(56) References Cited

U.S. PATENT DOCUMENTS

| 2017/0357076 | A1* | 12/2017 | Scheele | G02B 7/026 |
| 2018/0171991 | A1* | 6/2018 | Miller | F16F 15/06 |
| 2018/0321503 | A1* | 11/2018 | Brown | G02B 27/646 |
| 2019/0018258 | A1 | 1/2019 | Minamisawa et al. | |
| 2019/0136839 | A1* | 5/2019 | Miller | F03G 7/06 |
| 2019/0268513 | A1* | 8/2019 | Lim | H04N 23/63 |
| 2020/0120277 | A1* | 4/2020 | Wade | H04N 25/60 |
| 2020/0314338 | A1* | 10/2020 | Johnson | H04N 23/68 |
| 2021/0051258 | A1* | 2/2021 | Bjorstrom | H04N 23/55 |

OTHER PUBLICATIONS

International Search Report and Written Opinion of PCT/GB2021/052252 dated Dec. 13, 2021.

\* cited by examiner

ACTUATOR ASSEMBLY

CROSS-REFERENCE TO RELATED APPLICATIONS

This application is a national stage application under 35 U.S.C. § 371 of International Application No. PCT/GB2021/052252, filed Aug. 31, 2021, which claims priority of GB Patent Application Nos. 2013658.6, filed Aug. 31, 2020, 2015412.6, filed Sep. 29, 2020, 2017761.4, filed Nov. 11, 2020, and 2110839.4, filed Jul. 28, 2021, the disclosures of each of which are hereby incorporated by reference herein in their entireties.

FIELD

The present invention relates to actuator assemblies, particularly those in which optical image stabilisation (OIS) is provided.

BACKGROUND

In a camera, the purpose of OIS is to compensate for camera shake, that is vibration of the camera, typically caused by user hand movement, that degrades the quality of the image captured by the image sensor. Mechanical OIS typically involves detecting the vibration by a vibration sensor such as a gyroscope sensor, and controlling, on the basis of the detected vibration, an actuator arrangement that adjusts the camera apparatus to compensate for the vibration. Several techniques for adjusting the camera apparatus are known. OIS by processing of a captured image is possible in principle but requires significant processing power. Accordingly, there has been developed mechanical OIS in which the optical system of the camera is adjusted mechanically.

A number of actuator arrangements employing mechanical OIS techniques are known and applied successfully in relatively large camera apparatuses, such as digital still cameras, but are difficult to miniaturise. Cameras have become very common in a wide range of portable electronic equipment, for example mobile telephones and tablet computers, and in many such applications miniaturisation of the camera is important. The very tight packaging of components in miniature camera apparatuses presents great difficulties in adding OIS actuators within the desired package.

In one type of mechanical OIS, a camera unit comprising an image sensor and a lens assembly for focusing an image on the image sensor is tilted relative to a support structure around two notional axes that are perpendicular to each other and to the light-sensitive region of the image sensor. Such a type of OIS will be referred to herein as "OIS-module-tilt". WO-2010/029316 and WO-2010/089529 each disclose actuator assemblies of this type in which a plurality of shape memory alloy (SMA) actuator wires are arranged to drive tilting of the camera unit.

In another type of mechanical OIS, a lens assembly is moved orthogonally to the optical axis of the at least one lens. Such a type of OIS will be referred to herein as "OIS-lens shift". WO-2013/175197 and WO-2014/083318 each disclose actuator assemblies of this type in which a plurality of SMA actuator wires are arranged to drive movement of the lens assembly.

WO-2017/072525 discloses an image sensor mounted on a carrier that is suspended on a support structure by a bearing that allows movement of the carrier and the image sensor relative to a support structure in any direction laterally to the light-sensitive region of the image sensor. An actuator arrangement comprising plural shape memory alloy wires is arranged to move the carrier and the image sensor relative to the support structure for providing OIS of the image captured by the image sensor.

The actuator assembly may be part of a camera apparatus that can be connected to a device such as a mobile phone handset. Components of the actuator assembly such as the image sensor are required to be electrically connected to the device, for example for power and/or data transfer. The electrical connection to the image sensor can hinder the movement of the image sensor during OIS.

The present invention is concerned with an alternative actuator assembly that can provide an electrical connection to the image sensor.

SUMMARY

According to the present invention, there is provided an actuator assembly comprising: a support structure; an image sensor assembly comprising an image sensor having a light-sensitive region, the image sensor assembly being suspended on the support structure in a manner allowing movement of the image sensor assembly relative to the support structure in any direction laterally to the light-sensitive region; and at least two flexible printed circuits, each electrically connected at one end to the image sensor assembly, wherein the flexible printed circuits fold around the image sensor assembly such that their other ends are at the same side of the image sensor assembly.

The present invention therefore provides a flexible connection to the image sensor assembly. The movement of the image sensor assembly during OIS may be less hindered. By providing that the flexible printed circuits end on the same side of the image sensor assembly, the electrical connection to a device such as a mobile phone handset is simplified.

The present invention provides particular advantage when applied to an actuator assembly for a miniature camera, for example where the light-sensitive region has a diagonal length of at most 12 mm or 15 mm.

BRIEF DESCRIPTION OF THE DRAWINGS

To allow better understanding, an embodiment of the present invention will now be described by way of non-limitative example with reference to the accompanying drawings, in which.

DETAILED DESCRIPTION

Camera Apparatus Incorporating a Sensor Shift Assembly

Figure 1:
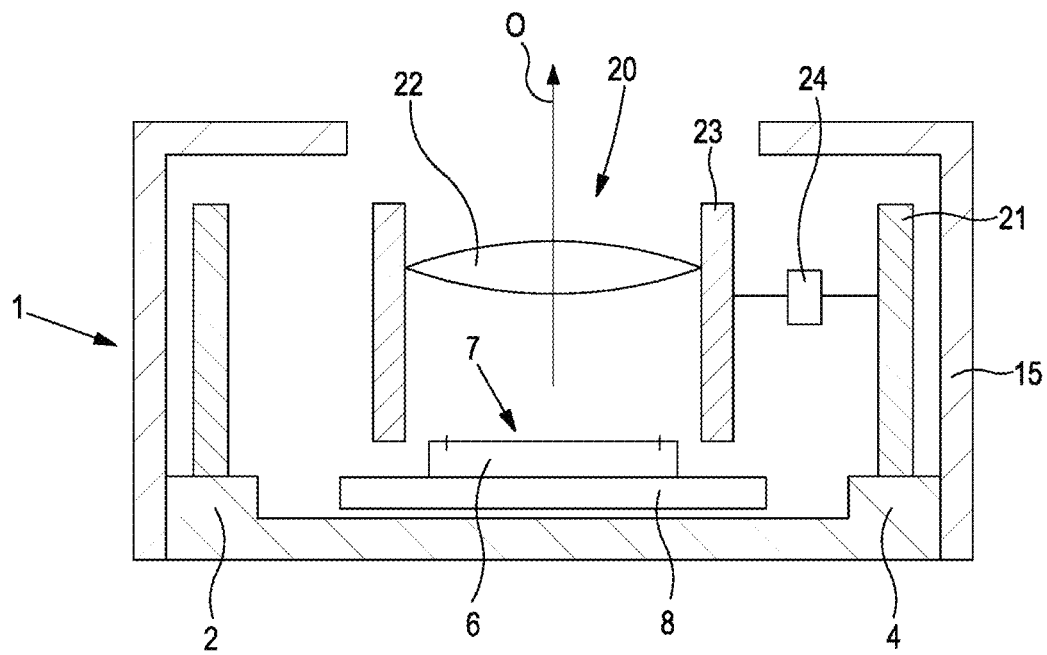
FIG. 1 is a schematic cross-sectional view of a camera apparatus including a sensor shift assembly.

A camera apparatus 1 that incorporates a sensor shift assembly 2 in accordance with the present invention is shown in FIG. 1, which is a cross-sectional view taken along the optical axis O. The camera apparatus 1 is to be incorporated in a portable electronic device such as a mobile telephone, or tablet computer. Thus, miniaturisation is an important design criterion.

Figure 2:
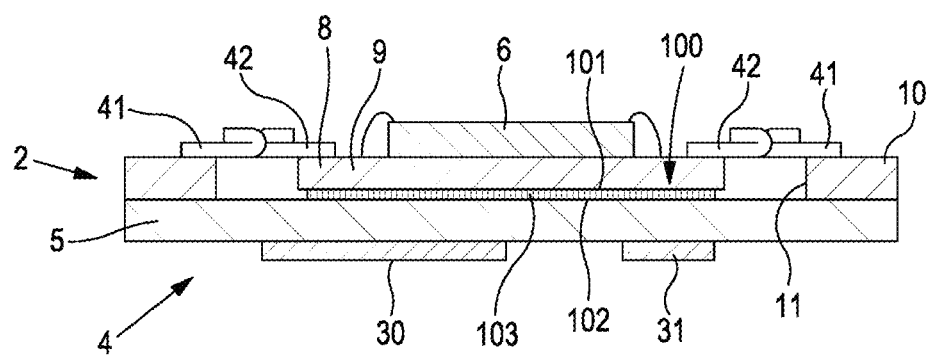
FIG. 2 is a cross-sectional view of the sensor shift assembly.
Figure 3:
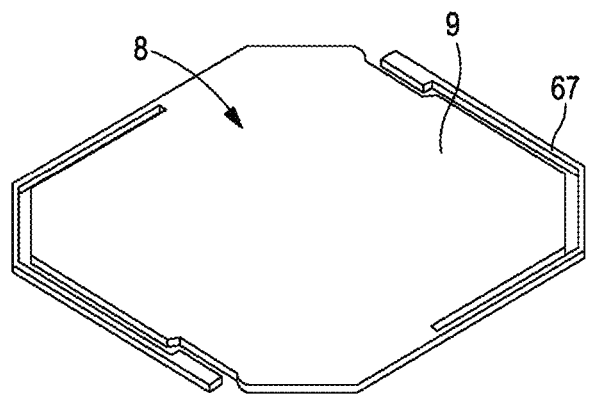
FIG. 3 is a perspective view of a moving plate of a carrier of the sensor shift assembly.
Figure 4:
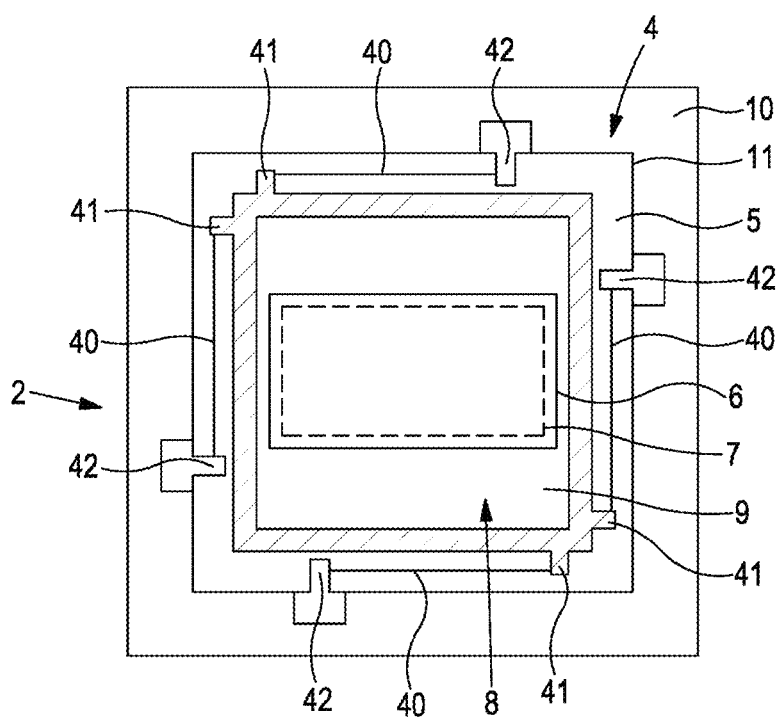
FIG. 4 is a plan view of the sensor shift assembly from above.

The sensor shift assembly 2 is shown in detail in FIGS. 2 to 4, FIG. 2 being a side view of the sensor shift assembly 2, FIG. 3 being a perspective view of a moving plate 9 of a carrier 8 of the sensor shift assembly 2; and FIG. 4 being a plan view of the sensor shift assembly 2. For clarity, FIGS. 2 and 4 omit the flexures 67 described below. The sensor shift assembly 2 may be manufactured first and then assembled with the other components of the camera apparatus 1.

The sensor shift assembly 2 comprises a support structure 4 on which is supported an image sensor assembly 6. The image sensor assembly 6 comprises an image sensor having a light-sensitive region 7 and generally further comprises a printed circuit board (PCB) on which the image sensor is mounted. The optical axis O is orthogonal to the light-sensitive region 7. The image sensor captures an image and may be of any suitable type, for example a CCD (charge-coupled device) or a CMOS (complementary metal-oxide-semiconductor) device. As is conventional, the image sensor has a rectangular light-sensitive region 7. Without limitation to the invention, in this example the camera apparatus 1 is a miniature camera in which the light-sensitive region 7 has a diagonal length of at most 12 mm.

Optionally, the image sensor assembly 6 is mounted on a carrier 8 which comprises a moving plate 9. The moving plate 9 may be formed from sheet material, which may be a metal for example steel such as stainless steel. The moving plate 9 is shown in isolation in FIG. 3 and includes flexures 67 that are described in more detail below.

Although the carrier 8 comprises a single moving plate 9 in this example, optionally the carrier 8 may comprise other layers which may be attached to or laminated with the moving plate 9.

Optionally, the support structure 4 comprises a support plate 5 which may be formed from sheet material, which may be a metal for example steel such as stainless steel.

Although the support structure 4 comprises a single support plate 5 in this example, optionally the support structure 4 may comprise other layers which may be attached to or laminated with the support plate 5.

The support structure 4 further comprises a rim portion 10 fixed to the front side of the support plate 5 and extending around the support plate 5. The rim portion 10 has a central aperture 11.

The camera apparatus 1 and/or the device comprises an integrated circuit (IC) chip 30 and a gyroscope sensor 31 which, in the illustrated example, are fixed on the rear side of the support plate 5. A control circuit described further below is implemented in the IC chip 30.

The moving plate 9, together with the image sensor assembly 6, is suspended on the support structure 4 in a manner allowing movement of the image sensor assembly 6 in any direction laterally to the light-sensitive region 7 (i.e. laterally of the optical axis O and parallel to the plane in which the light-sensitive region 7 extends) and further allowing rotation of the image sensor assembly about an axis parallel to the optical axis O. In the illustrated example, the moving plate 9 is suspended on the support structure 4 by a suspension system in the form of a plain bearing 100 provided between the support plate 5 and the moving plate 9 as will be described below.

Electrical Connection of the Image Sensor Assembly

Figure 5:
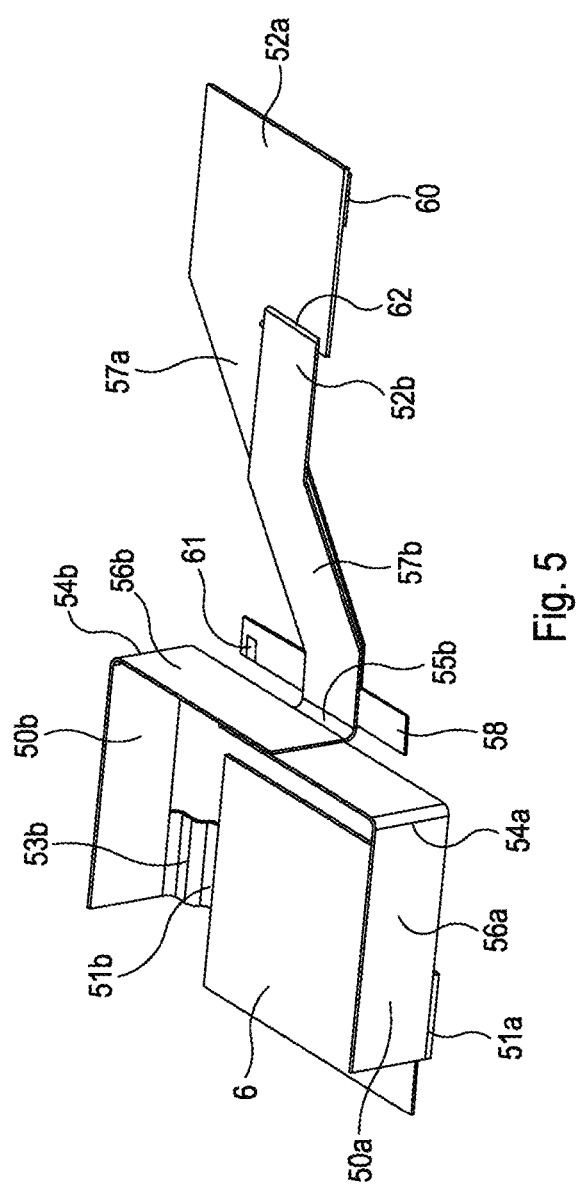
FIG. 5 is a perspective view of an electrical connection of the image sensor assembly.

FIG. 5 is a perspective view of an electrical connection of the image sensor assembly 6. FIG. 5 shows the parts of the sensor shift assembly that provide an electrical connection for the image sensor assembly 6. The electrical connection may be for connecting the image sensor to the portable electronic device such as a mobile telephone, or tablet computer. The electrical connection may be for providing power from the device to the image sensor. The electrical connection may be for allowing transfer of data such as image data from the image sensor to the device. The electrical connection may be for other purposes, for example providing control signals for autofocus and/or OIS, as will be described below.

As shown in FIG. 5, the sensor shift assembly 2 comprises at least two flexible printed circuit (FPC) portions 50 (hereinafter referred to simply as FPCs). The FPCs 50 are sections of FPC tape. The FPCs 50 may have a conventional construction, for example comprising a flexible substrate made of a suitable material, for example a plastic such as polyimide, PEEK or polyester.

Figure 12:
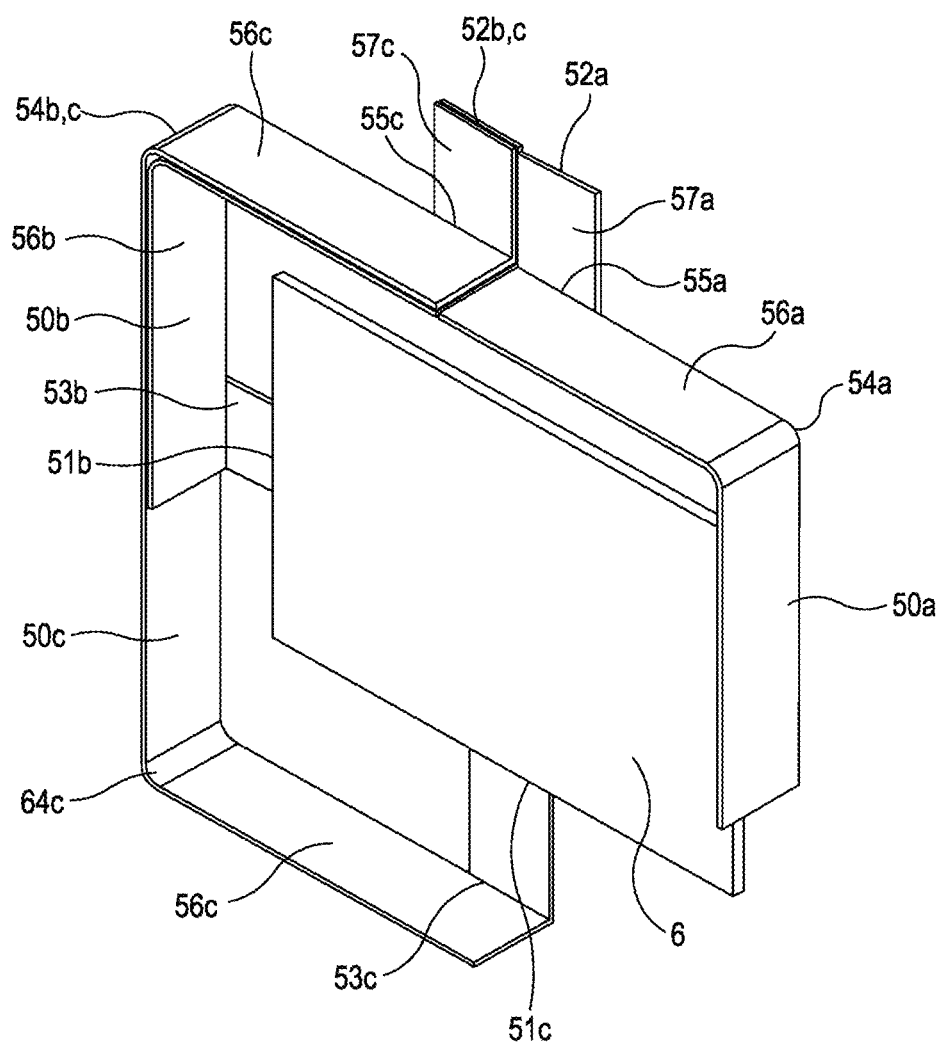
FIG. 12 is a perspective view of a yet further alternative electrical connection of the image sensor assembly.
Figure 13:
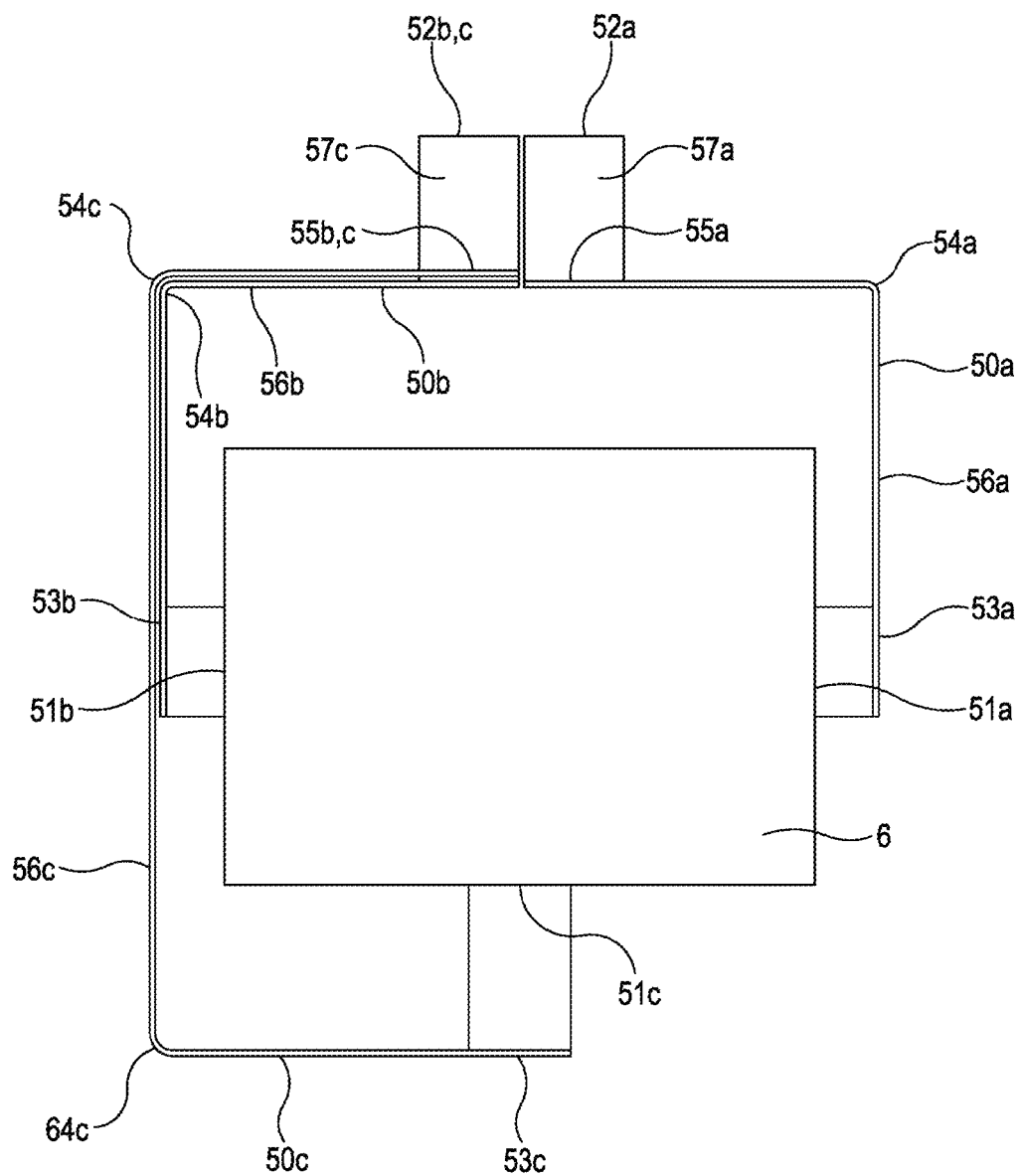
FIG. 13 is a plan view of the yet further alternative electrical connection of the image sensor assembly from above.

In the example shown in FIG. 5, there are two FPCs. However, more FPCs 50 may be provided, for example three (as shown in FIGS. 12 and 13), four, or only one FPC 50 may be provided. Each FPC 50 is connected at one end 51 to the image sensor assembly 6. The FPCs 50 may be electrically and mechanically connected to (or may be an extension of) the PCB on which the image sensor is mounted. The FPCs 50 may be electrically connected to the image sensor such that power can be provided to the image sensor and/or image data can be read from the image sensor.

As shown in FIG. 5, the FPCs 50 fold (or bend) around the image sensor assembly 6. The FPCs 50 extend from the end 51 connected to the image sensor assembly 6 alongside the image sensor assembly 6, and are then bent around corners before extending to the other end 52 of the FPCs 50.

As the FCP 50 is arranged folded around a corner at a corner fold 54, it accommodates the motion of the image sensor assembly 6 relative to the support structure 4 in any direction in the plane perpendicular to the optical axis O (including rotation of the image sensor assembly 6 about an axis parallel to the optical axis O). An FPC 50 will typically flex in a single direction perpendicular to its face, while resisting motion in other directions transverse to its face or along its length. However, as the FPC 50 is folded, the two parts of the FPC 50 on each side of the corner fold 54 can accommodate motion in different directions with minimal strain. That is, the part of the FPC 50 on one side of the corner fold 54 can accommodate motion of the image sensor assembly in direction X (left-right in FIG. 6) and the part of the FPC 50 on the other side of the corner fold 54 can accommodate motion of the image sensor assembly 6 in direction Y (up-down in FIG. 6).

In this example, the corner fold 54 is of 90 degrees and extends along an axis parallel to the optical axis O, which is perpendicular to the plane of the image sensor. This is advantageous because it provides the best accommodation of motion of the image sensor assembly 6 relative to the support structure 4 in the plane perpendicular to the optical axis O, although other configurations with a fold around a corner may provide similar effects.

Figure 6:
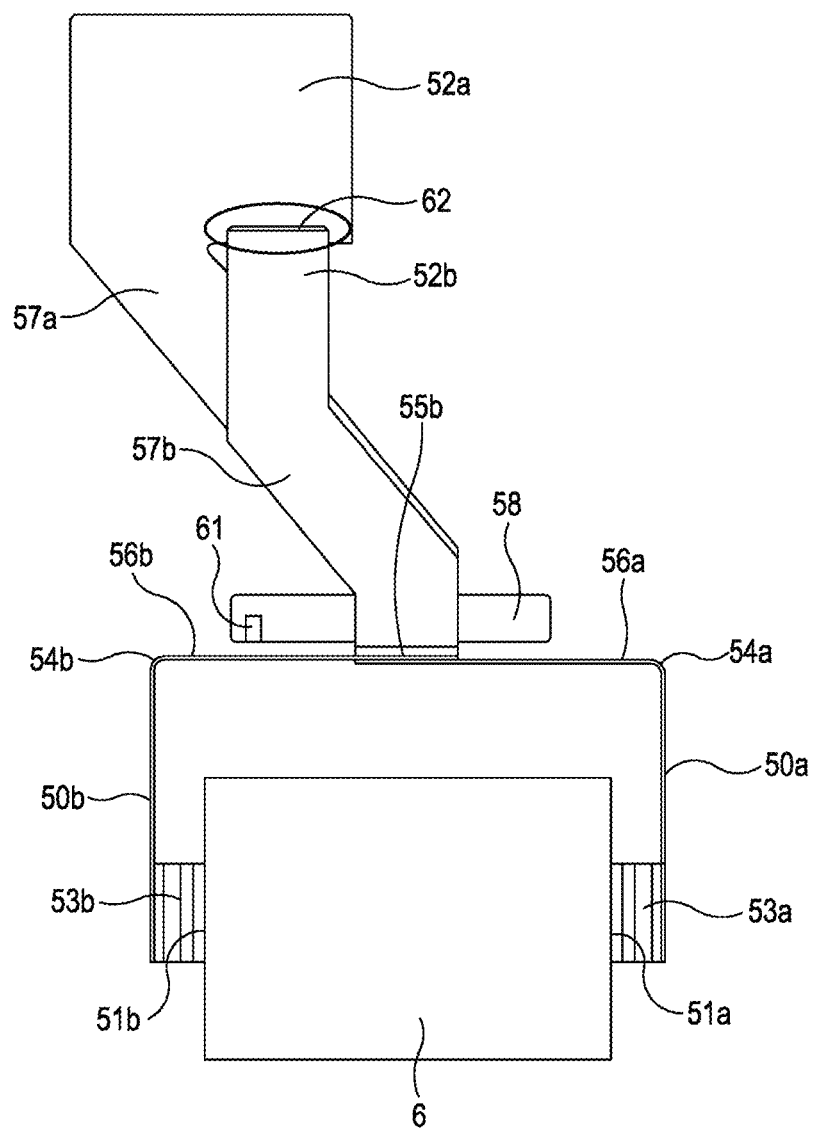
FIG. 6 is a plan view of the electrical connection of the image sensor assembly from above.

As shown in FIG. 5, the FPCs 50 fold around the image sensor assembly 6 such that their other ends 52 are at the same side of the image sensor assembly 6. FIG. 6 shows a plan view of the electrical connection shown in FIG. 5. In the view of FIG. 5, the ends 52 of the FPCs 50 are at the +Y side of the image sensor assembly 6 (which is elongate in the X direction). Alternatively, the ends 52 may be arranged at the −Y side, the +X side or the −X side of the image sensor assembly 6.

The FPCs 50 may comprise different electrical connections. In order for all of the electrical connections to be properly formed, all of the FPCs 50 are required to be connectable to the device. By providing that the ends 52 of the FPCs 50 are at the same side of the image sensor assembly 6, the connection of the FPCs 50 to the device is simplified.

The device comprises electrical circuitry, for example for transferring power and data. By providing that the ends 52 of the FPCs 50 are at the same side of the image sensor assembly 6, all of the circuitry of the device configured to connect to the sensor shift assembly 2 can be provided together within the same region of the device.

Of course, it is possible that the ends 52 of the FPCs 50 could be at different sides of the image sensor assembly 6. The two ends 52a, 52b could be connected to different sections of the device. Optionally, the internal circuitry of the device could be arranged to route the continuation of the ends 52 within the device to be near each other if required. However, as will be appreciated, this may be disadvantageous.

FIG. 6 is a view of the image sensor assembly 6 looking along the optical axis O towards the light-sensitive region 7. As shown in FIG. 6, optionally two FPCs 50 are provided. A first FPC 50a is connected to the +X side of the image sensor assembly 6 at one end 51a. At this end 51a of the FPC 50a, the plane of the FPC 50a is parallel to the plane of the image sensor assembly 6, which enables connection to the image sensor assembly 6. The other end 52a of the FPC 50a is for connecting to the device.

The first FPC 50a comprises a connection fold 53a. The connection fold 53a is primarily for changing the orientation of the plane of the FPC 50a. The connection fold 53a is between the section of the FPC 50a that connects to the image sensor assembly 6 (this section being parallel to the plane of the image sensor assembly 6) and the folded section 56a of the FPC 50a that is folded around the image sensor assembly 6. Optionally, the folded section 56a has a normal that is perpendicular to the normal of the plane of the image sensor assembly 6. Alternatively, the angle between the normal of the folded section 56a and the normal of the image sensor assembly 6 is not 90 degrees.

Optionally, the connection fold 53a comprises a plurality of folds. For example, as visible in the connection fold 53b of the second FPC 50b in FIG. 5, the connection fold 53a may comprise a plurality of folds along parallel axes. The folds may alternately fold in different directions so as to create a shape of steps between the end 51a connected to the image sensor assembly 6 and the folded section 56a.

As shown in FIG. 6, the folded section 56a comprises a corner fold 54a. As the folded section 56a of the FCP 50a is arranged folded around a corner at a corner fold 54a, it accommodates the motion of the image sensor assembly 6 relative to the support structure 4 in any direction in the plane perpendicular to the optical axis O. As the folded section 56a of the FPC 50a is folded, the two parts of the folded section 56a on each side of the corner fold 54a can accommodate motion in different directions with minimal strain. Optionally, the two parts of the folded section 56a are parallel to adjacent sides of the (centred) image sensor assembly 6, although this is not essential.

Optionally, the folded section 56a comprises only one corner fold 54a. The folded section 56a extends along only two sides of the image sensor assembly 6. This makes the construction of the electrical connection relatively simple.

As shown in FIG. 6, the FPC 50a comprises a static section 57a. The plane of the static section 57a may be parallel to the plane of the image sensor assembly 6. The FPC 50a comprises a transition fold 55a. The transition fold 55a is between the folded section 56a and the static section 57a. Optionally, the static section 57a remains substantially static during OIS. The folded section 56a may flex when the image sensor assembly 6 moves relative to the support structure 4. The static section 57a extends the electrical connection lines away from the image sensor assembly 6.

As shown in FIGS. 5 and 6, the sensor shift assembly 2 comprises a second FPC 50b. The second FPC 50b has the same features as the first FPC 50a described above. For example, the second FPC 50b comprises one end 51b connected to the image sensor assembly 6, another end 52b away from the image sensor assembly 6, a connection fold 53b for angling the plane of the FPC 50b away from the plane of the image sensor assembly 6, a folded section 56b for folding around the image sensor assembly 6, a corner fold 54b for changing the direction of extension of the folded section 56b and a transition fold 55b between the folded section 56b and a static section 57b.

Optionally, the FPCs 50 fold around the image sensor assembly 6 in different directions. When viewed along the optical axis O facing the light-sensitive region 7, the folded section 56a of the first FPC 50a is folded anti-clockwise from the end 51a connected to the image sensor assembly 6. The folded section 56b of the second FPC 50b is folded clockwise from the end 51b connected to the image sensor assembly 6. Of course, alternatively, the FPCs 50 may be folded in the same rotational direction around the image sensor assembly 6. For example, one FPC may be connected to e.g. the +X side of the image sensor assembly 6 and may extend e.g. clockwise around the image sensor assembly 6 to e.g. the −Y side of the image sensor assembly 6, while another FPC may be connected to e.g. the −X side of the image sensor assembly 6 and may extend in the same rotational direction around the image sensor assembly 6 to e.g. the +Y side of the image sensor assembly 6.

Figure 7:
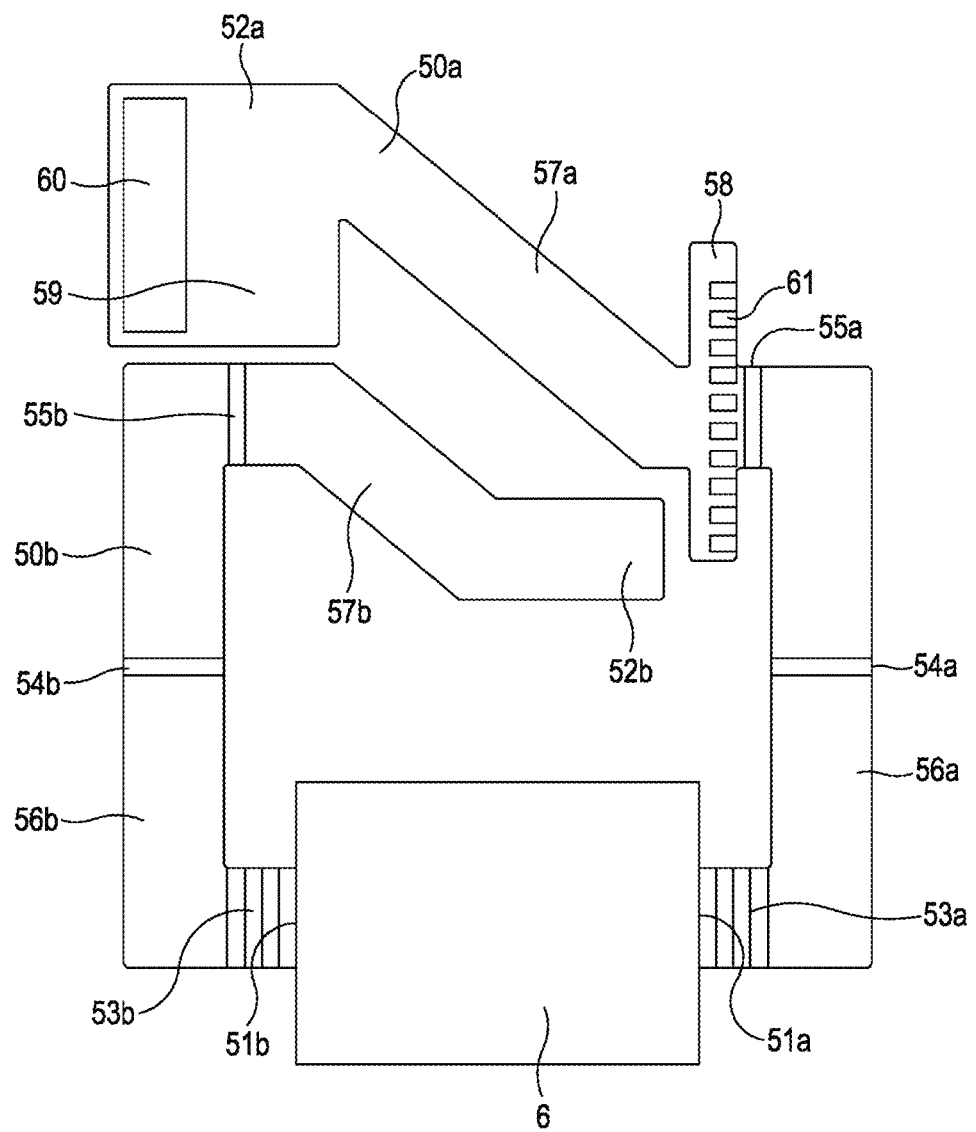
FIG. 7 is a plan view of the electrical connection of the image sensor assembly with the flexible printed circuits unfolded.

FIG. 7 is a plan view of the electrical connection of the image sensor assembly 6 with the FPCs 50 unfolded. The FPCs 50 may be initially formed as planar tapes. The folds 53, 54, 55 are indicated in FIG. 7. Optionally, the connection folds 53 are folded such that the folded sections 56 are folded to be on the light-sensitive region side of the image sensor assembly 6. This means folding the connection folds 53 towards the viewer in the orientation shown in FIG. 7. Most and preferably all of the folded sections 56 are between the image sensor assembly 6 and e.g. the top of the lens assembly 20 in the axial direction (the lens assembly 20 is described below). This reduces or eliminates the extent to which the FPCs 50 increase the height (i.e. length along the optical axis O) of the camera apparatus 1.

As shown in FIG. 7, optionally the sensor shift assembly 2 comprises a device connector 60. The device connector may be provided at the end 52a of one of the FPCs 50a. The device connector 60 is configured to connect the sensor shift assembly 2 to the device, for example the handset. The device connector 60 may be configured to detachably attach the camera apparatus 1 to the device. The device connector 60 may be configured to clip into a complementarily shaped slot of the device. The device connector 60 comprises terminals of the electrical connection lines of the FPCs 50.

Optionally, at least two FPCs 50 are electrically connectable to the device via the same device connector 60. This can make it easier to attach and detach the camera apparatus 1 to/from the device. Alternatively, separate device connectors 60 may be provided for different FPCs 50.

Optionally, at least two FPCs 50 are connected to each other away from the image sensor assembly 6. For example, as shown in FIG. 6 the FPCs 50 are connected to each other at a connection point 62. For example, at the connection point 62 the electrical connection lines of the second FPC 50b may be connected (e.g. by soldering) to extension lines on the first FPC 50a. Optionally, the static sections 57 of at least two FPCs 50 overlap each other. This reduces the lateral space taken up by the FPCs 50.

As shown in FIG. 7, optionally the first FPC 50a comprises an increased-width region 58. The increased-width region 58 may be configured to accommodate the extension lines connected to the electrical connection lines from the second FPC 50b. Alternatively, the FPCs 50 may be kept separately from each other. They may have separate device connectors.

As shown in FIG. 7, optionally at least two (and optionally all) FPCs 50 are arranged such that they do not overlap each other when in their unfolded state. When the FPCs 50 are connected to the image sensor assembly 6 and are not folded, the FPCs 50 do not overlap each other. This allows the FPCs 50 to be formed initially in a single plane. This simplifies manufacture of the sensor shift assembly 2.

Alternative Electrical Connections of the Image Sensor Assembly

Figure 8:
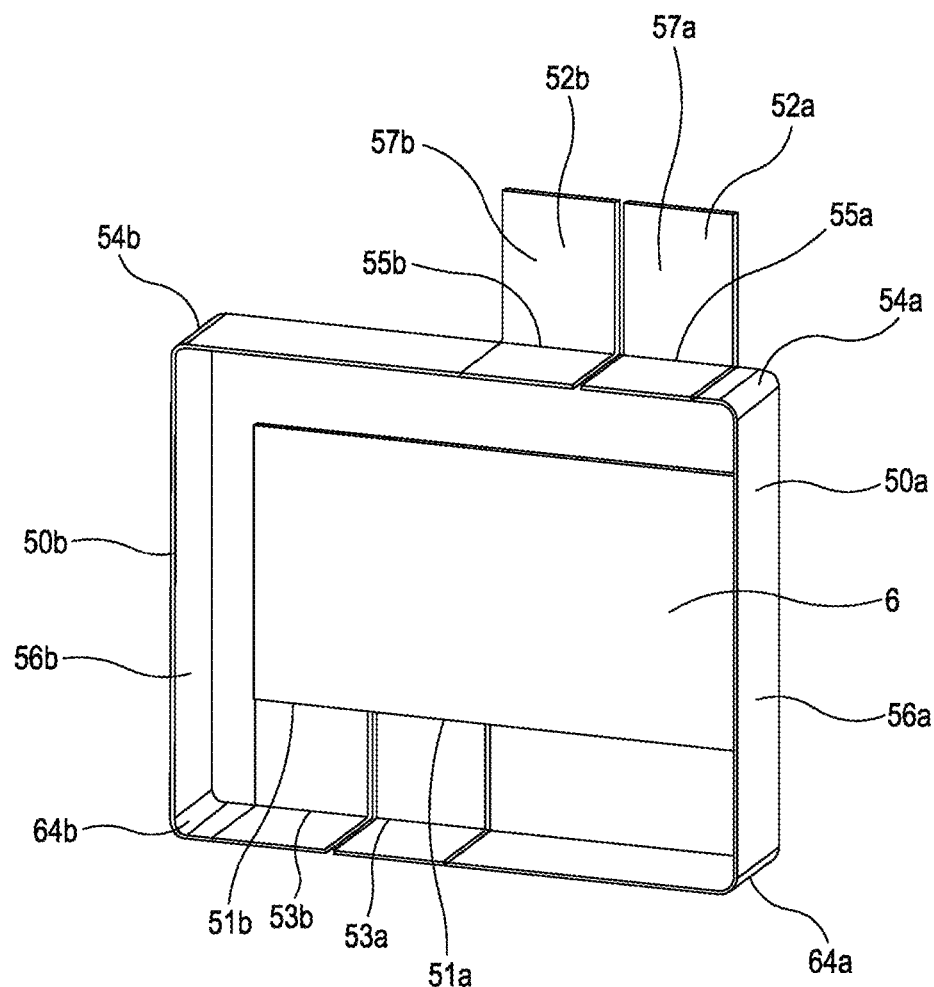
FIG. 8 is a perspective view of an alternative electrical connection of the image sensor assembly.
Figure 9:
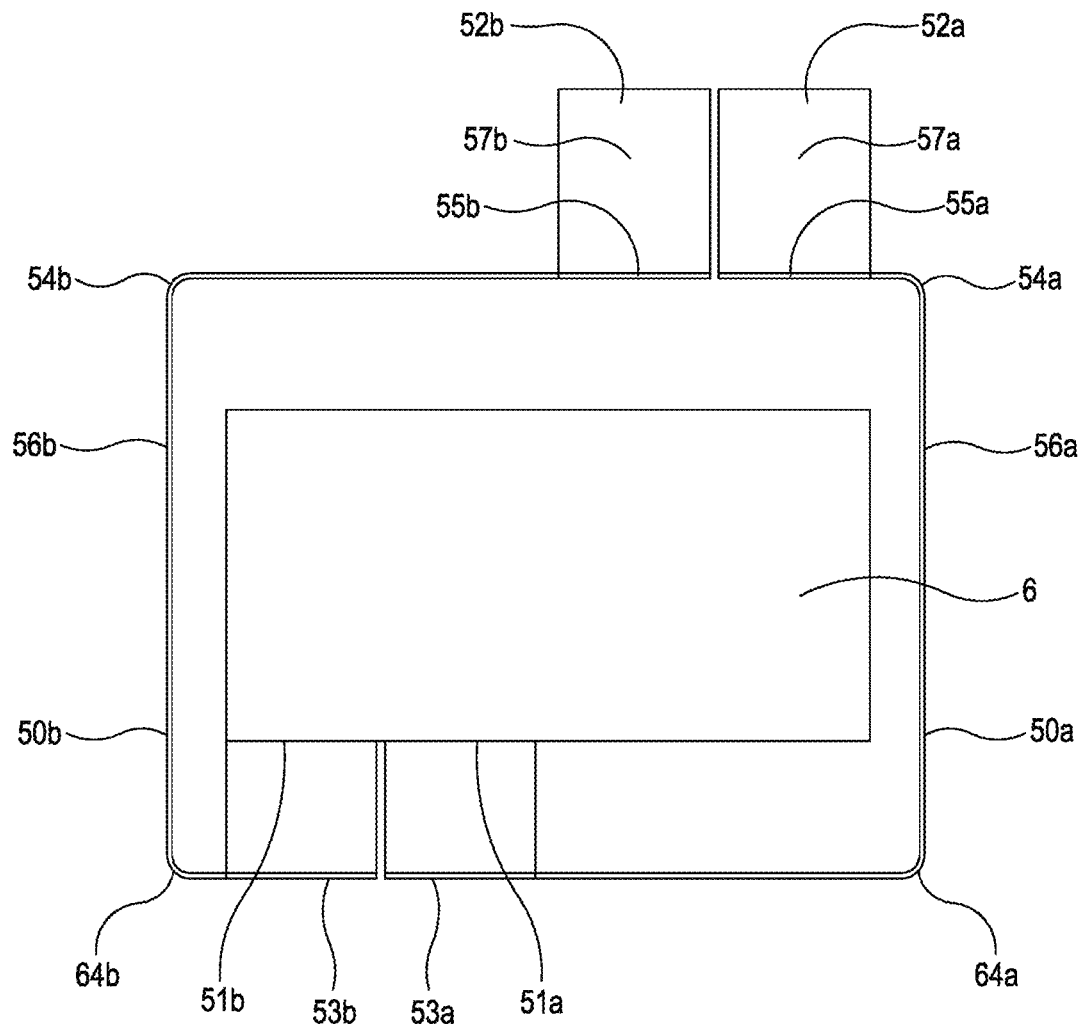
FIG. 9 is a plan view of the alternative electrical connection of the image sensor assembly from above.

FIG. 8 is a perspective view of an alternative electrical connection of the image sensor assembly 6. FIG. 9 is a plan view of the alternative electrical connection of the image sensor assembly 6 shown in FIG. 8. As shown in FIG. 8, optionally at least two FPCs 50 are connected to the same side of the image sensor assembly 6. FIGS. 8 and 9 show two FPCs 50 connected to the −Y side of the image sensor assembly 6.

Many details of the FPCs 50 shown in FIGS. 8 and 9 are the same as those described above and show in FIGS. 5-7. The description below focuses on the differences. As shown in FIG. 8, optionally the static sections 57 of at least two FPCs 50 are adjacent to each other. The static sections 57 may be non-overlapping. Optionally, a single device connector 60 may be provided for connecting the electrical connection lines of both/all adjacent FPCs 50 to the device.

As shown in FIGS. 8 and 9, optionally the folded sections 56 comprises two corner folds 54, 64. The folded sections 56 extend further around the image sensor assembly 6 than the arrangement shown in FIGS. 5-7. The folded sections 56 extend along three sides of the image sensor assembly 6. The folded sections 56 are longer than in the arrangement of FIGS. 5-7. By providing longer folded sections 56, the stiffness of the FPCs 50 is reduced. This reduces any hindrance the FPCs 50 may cause to the movement of the image sensor assembly 6 during OIS.

Figure 10:
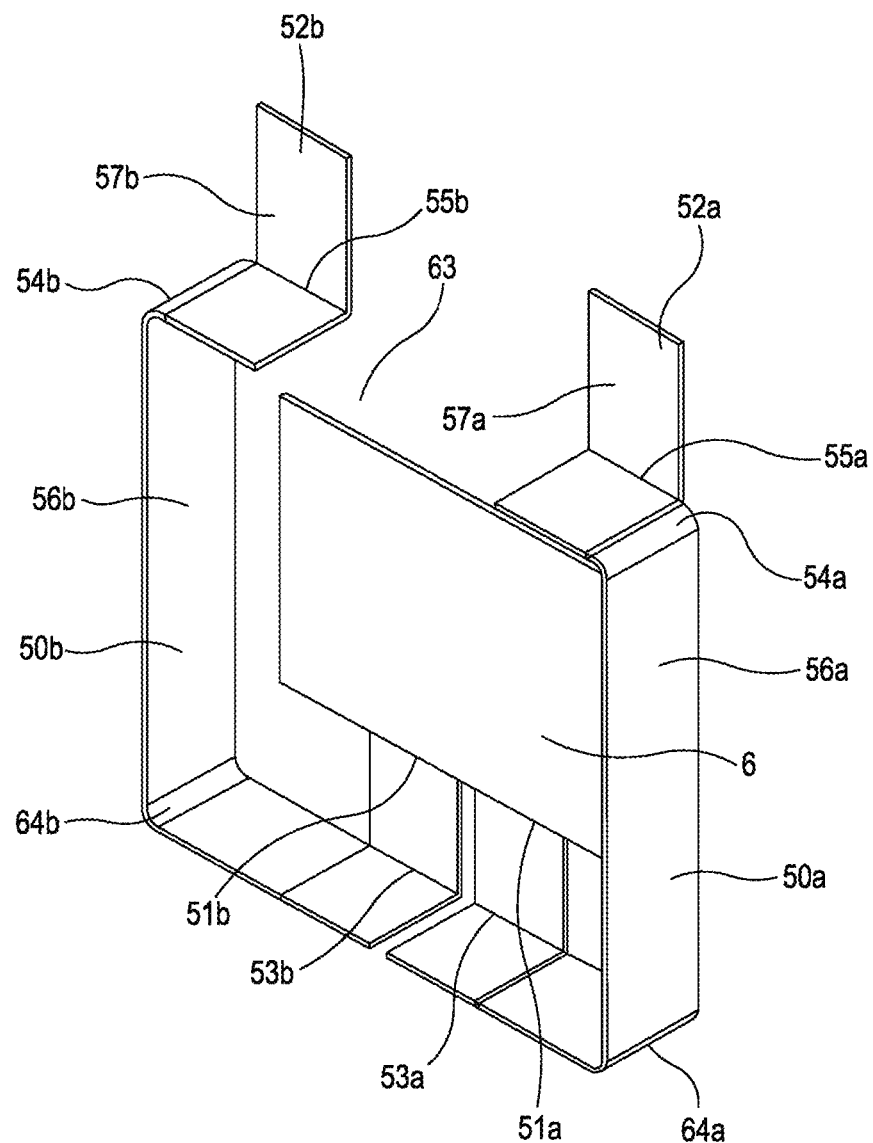
FIG. 10 is a perspective view of a further alternative electrical connection of the image sensor assembly.
Figure 11:
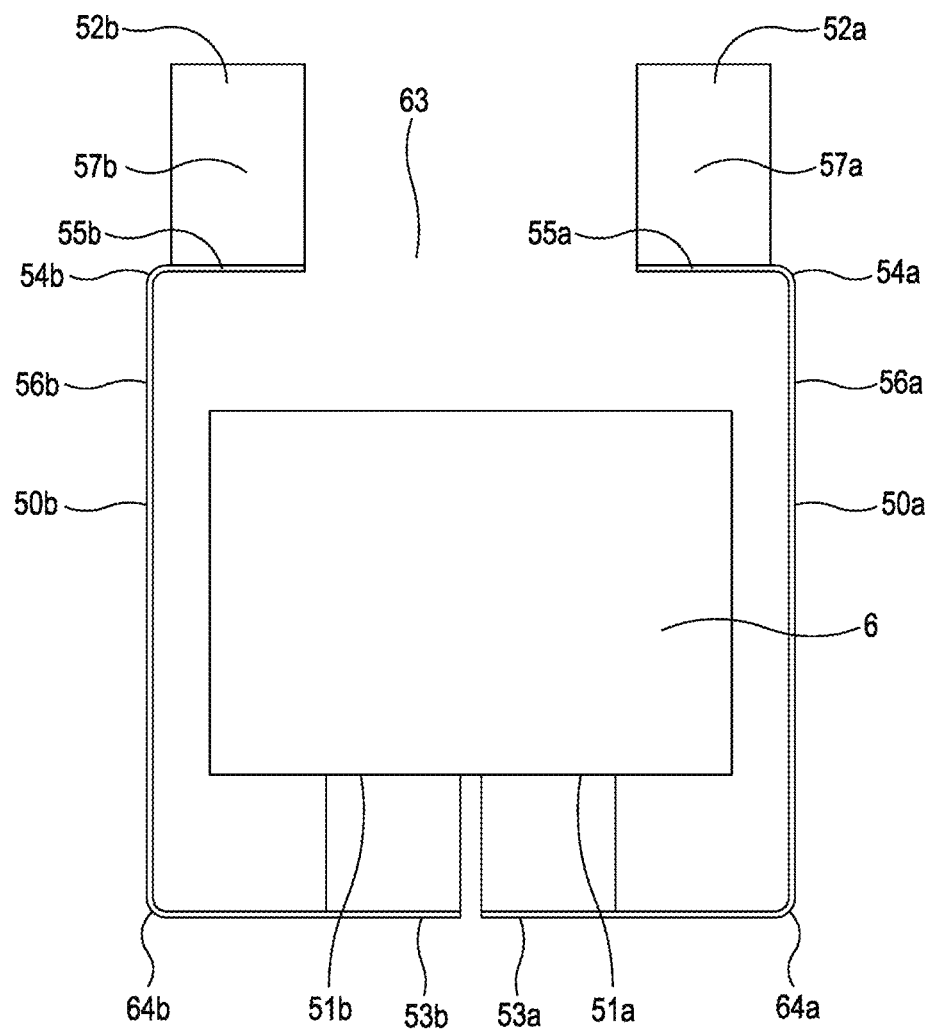
FIG. 11 is a plan view of the further alternative electrical connection of the image sensor assembly from above.

FIG. 10 is a perspective view of an alternative electrical connection of the image sensor assembly 6. FIG. 11 is a plan view of the alternative electrical connection of the image sensor assembly 6 shown in FIG. 10. As shown in FIG. 10, optionally at least two FPCs 50 are connected to the same side of the image sensor assembly 6. FIGS. 10 and 11 show two FPCs 50 connected to the −Y side of the image sensor assembly 6.

Many details of the FPCs 50 shown in FIGS. 10 and 11 are the same as those described above and show in FIGS. 5-7. The description below focuses on the differences. As shown in FIG. 10, optionally the static sections 57 of at least two FPCs 50 are distanced from each other. The static sections 57 may be non-overlapping.

Optionally a space 63 is provided along one side of the sensor shift assembly 2 where there is no FPC. Optionally, one or more terminals (not shown) may be provided in the space 63. The terminals may be for connecting to one or more actuators e.g. for performing autofocus (i.e. movement of the lens along the optical axis O).

As shown in FIGS. 10 and 11, optionally the folded sections 56 comprises two corner folds 54, 64. The folded sections 56 extend further around the image sensor assembly 6 than the arrangement shown in FIGS. 5-7. The folded sections 56 extend along three sides of the image sensor assembly 6. The folded sections 56 are longer than in the arrangement of FIGS. 5-7. By providing longer folded sections 56, the stiffness of the FPCs 50 is reduced. This reduces any hindrance the FPCs 50 may cause to the movement of the image sensor assembly 6 during OIS.

FIG. 12 is a perspective view of a yet further alternative electrical connection of the image sensor assembly 6. FIG.

13 is a plan view of the electrical connection shown in FIG. 12. As shown in FIG. 12, optionally more than two FPCs 50 are connected to the image sensor assembly 6. For example, three FPCs 50 may be provided. FIGS. 12 and 13 show three FPCs 50 connected to different sides of the image sensor assembly 6. A first FPC 50a is connected to the +X side, a second FPC 50b is connected to the −X side and a third FPC 50c is connected to the −Y side of the image sensor assembly 6. It is possible for four or more FPCs 50 to be provided.

Many details of the FPCs 50 shown in FIGS. 12 and 13 are the same as those described above and show in FIGS. 5-7. The description below focuses on the differences. As shown in FIG. 12, the static sections 57b, 57c of two FPCs 50b, 50c overlap. The static section 57a of the first FPC 50a is adjacent to the other static sections 57b, 57c. The folded section 57c of the third FPC 50c comprises two corner folds 54c, 64c.

By providing more FPCs 50, the widths of the FPCs 50 can be reduced while still having enough space for all of the electrical connection lines. The width of the FPCs 50 determines the height (i.e. along the optical axis O) taken up by the electrical connection. By providing more FPCs 50, less height is used, thereby helping to miniaturise the construction.

Optionally, most (and optionally all) of the folded sections 56 of the FPCs 50 that fold around the image sensor assembly 6 are between the image sensor assembly 6 and the top of the lens assembly 20 in the direction perpendicular to the plane of the image sensor assembly 6. The FPCs 50 carry electrical connection lines. The electrical connection lines may be provided for different functions. Optionally, the FPCs 50 comprise a power line for transferring electrical power to the image sensor assembly 6 Optionally, the FPCs 50 comprise a data lane for transferring data, for example image data. Optionally, the FPCs 50 comprise a signal line for transferring a control signal, for example to control an actuator.

Figure 28:
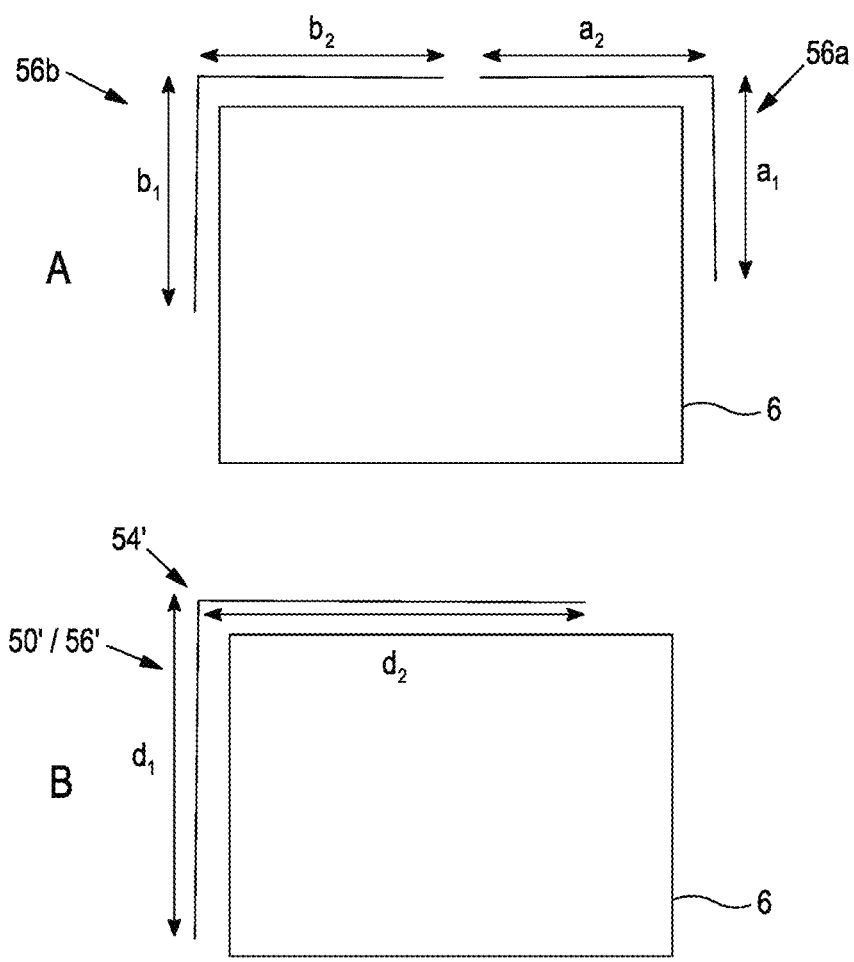
FIG. 28A is a schematic plan view of the electrical connection of the image sensor assembly of FIG. 5.
FIG. 28B is a schematic plan view of a fourth alternative electrical connection of the image sensor assembly.

Referring to FIGS. 28A and 28B, a fourth alternative electrical connection of the image sensor assembly 6 (referred to as 'the fourth interconnect') will now be described.

FIG. 28A is a schematic view of the electrical connection of the image sensor assembly 6 as described above with reference to FIG. 5. The folded section 56a of the first FPC 50a is made up of one part with length $a_1$ and another part with a length $a_2$, and has a total length $a=a_1+a_2$. The folded section 56b of the second FPC 50b is made up of one part with length $b_1$ and another part with a length $b_2$, and has a total length $b=b_1+b_2$. In some examples, $a=b$, $a_1=b_1$, and $a_2=b_2$.

FIG. 28B is a schematic view of the fourth interconnect. In contrast to the examples described above in which there are two or more FPCs 50, the fourth interconnect has only one FPC 50'. Except for the differences described below, this single FPC 50' may be equivalent to any of the above-described FPCs 50, e.g. the first, second or third FPC 50a, 50b, 50c. In particular, the FPC 50' may be folded in an equivalent way and/or may be equivalently positioned in relation to the other components of the camera apparatus 1. The FPC 50' may start (i.e. be connected to the image sensor assembly 6) on any of the four sides of the image sensor assembly 6 and may end on any of the four sides (including the side on which it started).

The FPC 50' may carry all of the electrical connections to the image sensor—and, in some examples, to a lateral actuator arrangement (described below)—and so the FPC 50' may have a greater width than the above-described FPCs 50 and/or may be formed from multiple layers of flexible printed circuit. Typically, the width of the FPC 50' is limited by the need for a low-height camera apparatus 1 and so multiple layers of flexible printed circuit are used. Such a multilayer FPC 50' may have two or three or four or five or more layers of flexible printed circuit. Adjacent layers may be adhered to each other.

Such a multilayer FPC 50' will be thicker and so will generally be stiffer and a greater hindrance to lateral movement of the image sensor assembly 6. To avoid or reduce this effect, the length of the FPC 50' may be increased compared to the above-described FPCs 50. As illustrated in FIG. 28B, the folded section 56' of the FPC 50' is made up of one part (between the image sensor assembly 6 and the corner fold 54') with length $d_1$ and another part (after the corner fold 54') with a length $d_2$, and has a total length $d=d_1+d_2$. In particular, the lengths $d_1$, $d_2$ of one, or preferably both, of these parts of the FPC 50' may be greater than the equivalent lengths $a_1$, $a_2$, $b_1$, $b_2$ in the first and second FPCs 50a, 50b (see FIG. 28A). Accordingly, the total length $d$ may be greater than the total lengths $a$, $b$. The lengths $d$, $d_1$, $d_2$ may be increased, for example, by 25% or more, or 50% or more. The lengths $d_1$, $d_2$ may correspond to a substantial proportion (e.g. >75%) of the length of the corresponding side of the image sensor assembly 6. For similar reasons, the multilayer FPC 50' may be folded around more than two (e.g. three or four) sides of the image sensor assembly 6.

Such a multilayer FPC 50' may include data, power and ground tracks that are arranged so as to optimise performance of the camera apparatus 1 (and use of the available space). These tracks may include some or all of the following: MIPI® and a hatched ground (for impedance matching), analogue power and ground for the sensor, high-speed communications and clocks with a digital ground, and actuator power and a separate ground. Different types of tracks (e.g. MIPI® versus analogue power) may be provided on different layers and/or on different parts of the same layer. In any case, the outward and return paths for a given signal (e.g. MIPI® and hatched ground) are preferably arranged on corresponding parts of adjacent layers (e.g. one on top of the other). This is so as to minimise the current loops and hence the potential for interference with other parts of the FPC 50', the image sensor assembly 6 and/or other components of the camera apparatus 1.

In addition, one or more solid ground layers (e.g. layers which simply include a relatively large, suitably-grounded track) may be provided between different layers of the FPC 50' and/or as one or both of the outermost layers of the FPC 50'. Again, such solid ground layers help to reduce interference between the various components of the camera apparatus 1. For example, by providing a solid ground layer that is closest to the image sensor assembly 6, the image sensor can be protected in this way. In another example, the FPC 50' includes the following sequence of layers: MIPI®, hatched ground, solid ground, high-speed data, etc.

In addition, a multilayer FPC 50' enables the weight (i.e. height) of copper to be varied between different layers so as to optimise the impedance of each layer.

Some of the above-described features of the FPC 50' may be present in the other FPCs 50, e.g. the first, second and/or third FPC 50a, 50b, 50c.

In the above-described examples in which there are multiple FPCs 50, the power line and the data lanes may be provided on different FPCs 50. For example, all of the data lanes may be provided on one (or more) FPCs 50. The power line(s) may be provided on another FPC 50 the has no data lanes. This can help reduce risk of interference between the power line(s) and the data lanes.

Figure 14:
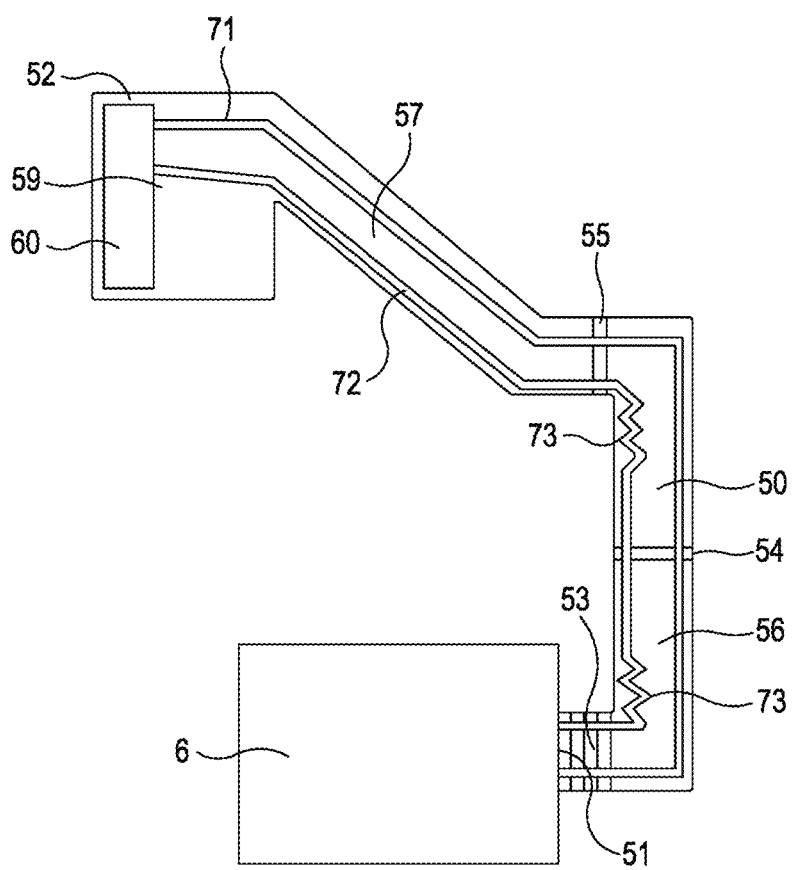
FIG. 14 is a plan view of data lanes of a flexible printed circuit.

FIG. 14 is a plan view of data lanes of an FPC 50. The FPC 50 comprises data lanes 71, 72. Optionally, the data lanes 71, 72 are configured for high speed data transfer. Optionally, the data lanes 71, 72 are MIPI® lanes. The data lanes 71, 72 may have substantially the same length as each other. This allows timing of the data transfer through different data lanes 71, 72 to be synchronized. Only two data lanes 71, 72 are shown in FIG. 14 for ease of explanation. There may be any number of data lanes provided.

As shown in FIG. 14 optionally at least one of the data lanes 72 comprises at least one meandering section 73 such that the data lanes 71, 72 have substantially the same length as each other. Without the meandering section 73, the outside data lane 71 would be longer than the inside data lane 72 because the outside data lane 71 is on the outside of the corners in the unfolded FPC 50. The position of the meandering section 73 is preferably close to where the length mismatch would occur, i.e. near the corners.

Figure 15:
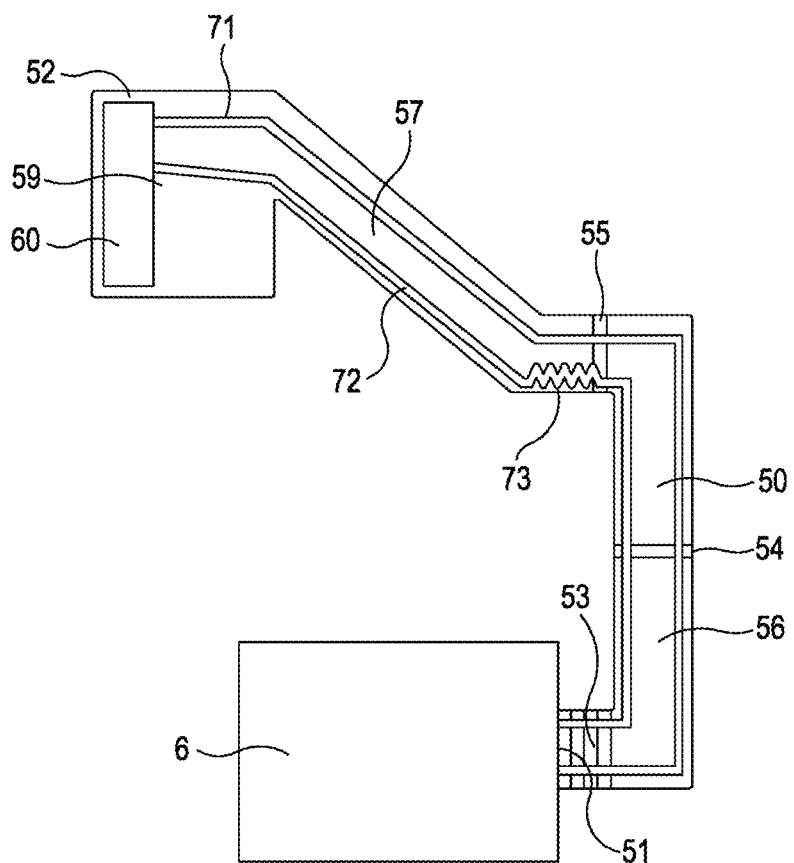
FIG. 15 is a plan view of data lanes of a flexible printed circuit.

FIG. 15 is a plan view of an alternative arrangement of data lanes of an FPC 50. The features of the FPC 50 shown in FIG. 15 are the same as the features of the FPC 50 shown in FIG. 14 with the following exception. The position of the meandering section 73 is different in the FPC 50 shown in FIG. 15 compared to the FPC 50 shown in FIG. 14. As shown in FIG. 15, the position of the meandering section 73 may be at least one place where the path of the unfolded FPC 50 turns a corner. As shown in FIG. 15, optionally the meandering section 73 is positioned in the static section 57a of the FPC 50. Additionally or alternatively, a meandering section may be positioned in the connection fold 53a.

As shown in FIG. 7, optionally at least one of the FPCs 50a comprises at least one terminal 61. The at least one terminal 61 may be for connecting the device (e.g. the handset) to at least one actuator in the camera apparatus 1, e.g. the axial actuator arrangement 24 and/or the lateral actuator arrangement (both of which are described below). A plurality of terminals 61 may be provided in an increased-width section 58 of the FPC 50a. The increased width allows a larger number of terminals 61 to be accommodated. Optionally at least one terminal 61 is provided on the opposite surface of the FPC 50a.

The above-described FPCs 50 are generally configured so as to reduce their stiffness in the X and Y directions and be less of a hindrance to movement of the image sensor assembly 6 in these directions. This leads to an FPC configuration which is thin and tall in the Z direction and so generally has a relatively high stiffness in the Z direction. As a consequence of this, any misalignment in the forming or assembly of the relevant components of the camera apparatus 1 such that one or more FPCs 50 are not located in their intended location will result in relatively large residual stresses in these FPCs 50. These residual stresses will tend to shift the image sensor assembly 6 in the Z direction, which may cause some of the bearings (e.g. the plain bearings 100) to lose contact, and this, in turn, can cause the image sensor assembly 6 to tilt during actuation or postural changes. The interconnects described below have a reduced the stiffness in the Z direction, which may avoid or reduce these undesirable effects.

Figure 29:
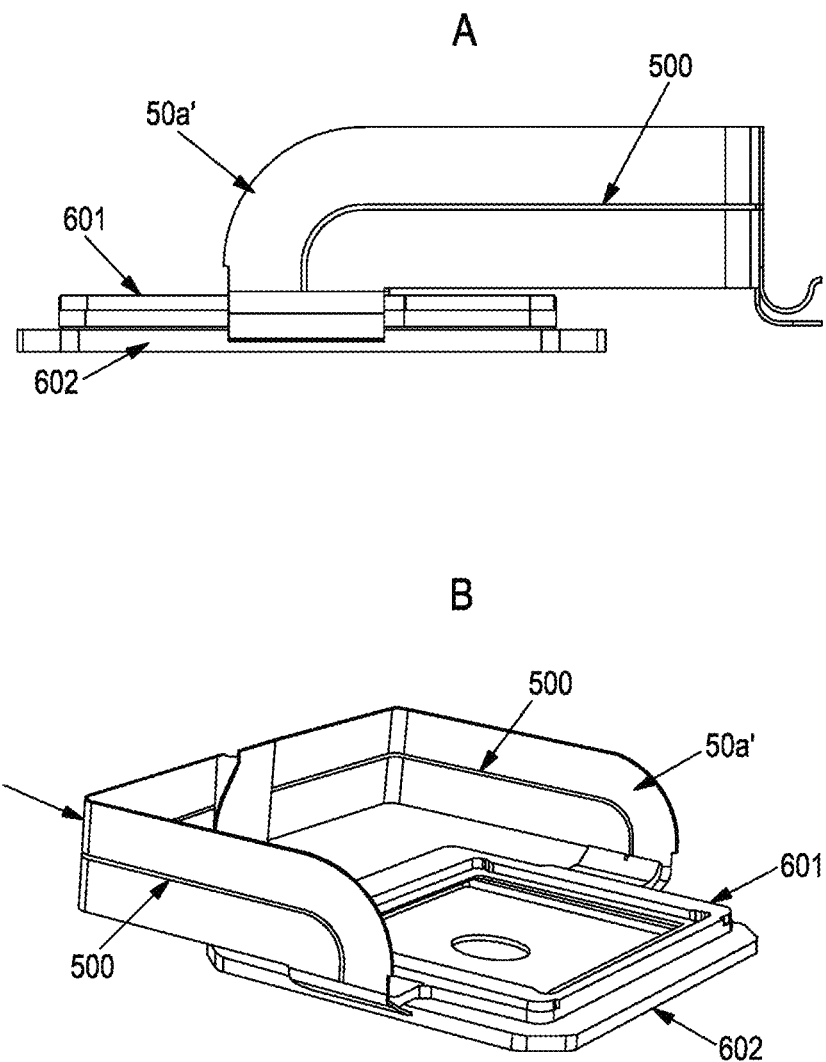
FIGS. 29A and 29B are perspective views of a fifth alternative electrical connection of the image sensor assembly.

Referring to FIGS. 29A and 29B, a fifth alternative electrical connection of the image sensor assembly 6 (referred to as 'the fifth interconnect') will now be described.

The fifth interconnect is substantially the same as the electrical connection of the image sensor assembly 6 described above with reference to FIG. 5, except that each of the first and second FPCs 50a', 50b' includes a split 500. The split 500 is along the length of folded section 56a', 56b and divides the folded section 56a', 56b' of the FPC 50a', 50b' into two parts (referred to as 'upper' and 'lower' parts). Such a split has been shown to decrease the stiffness of the FPCs 50a', 50b' in the Z direction by a factor of 5.

In this example, the upper and lower parts into which the FPCs 50a', 50b' are divided have substantially equal Z dimensions ('heights'). However, in other examples, the parts may have at least somewhat different heights. In some examples, each FPC 50 may include more than one split 500 (e.g. two or three splits 500) and may be divided vertically into more than two (e.g. three or four) parts. The split 500 need not extend the entire length of the folded section 56a', 56b' of the FPC 50a', 50b'. In principle, the different FPCs 50a, 50b may have different splits 500.

Figure 30:
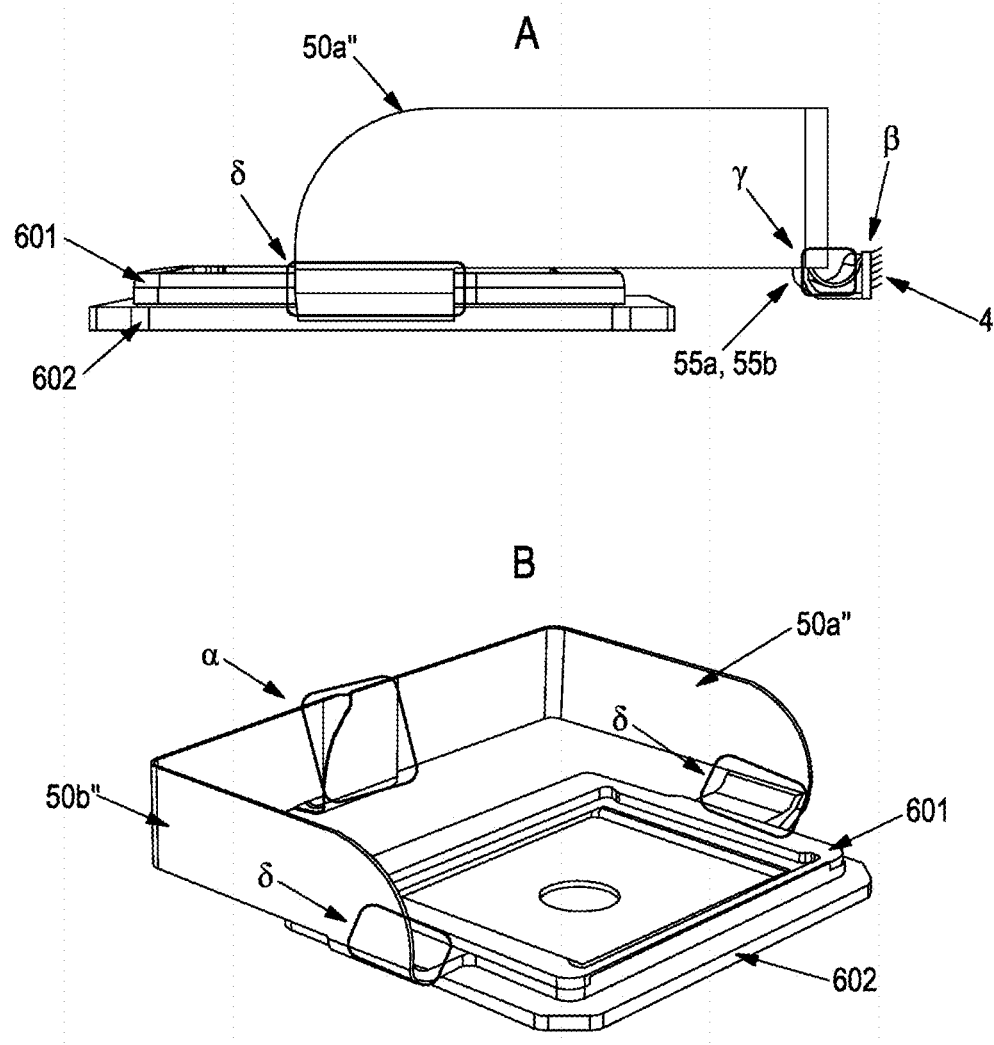
FIGS. 30A and 30B are perspective views of a sixth alternative electrical connection of the image sensor assembly.

Referring to FIGS. 30A and 30B, a sixth alternative electrical connection of the image sensor assembly 6 (referred to as 'the sixth interconnect') will now be described.

The sixth interconnect is substantially the same as the electrical connection of the image sensor assembly 6 described above with reference to FIG. 5, except for the following two sets of features.

Firstly, in the example of FIG. 5, where the first and second FPCs 50a, 50b meet (see the area α in FIGS. 29A and 29B), they are typically adhered to each other and to the static support structure 4. In contrast, in the fifth interconnect, the FPCs 50a'', 50b'' are not adhered to each other or to the support structure 4 in this area α. This shifts the region β at where the FPCs 50a'', 50b'' are fixed to the support structure 4 (and so are held static) further from the image sensor assembly 6 and, in particular, after the transition folds 55a, 55b. Furthermore, the FPCs 50a'', 50b'' may each include a flexible section γ between the transition folds 55a, 55b and this fixing region β. This flexible section γ is generally orientated perpendicularly to the Z direction and so significantly reduces the Z stiffness of the FPCs 50a'', 50b'', for example by a factor of 70.

Secondly, in the example of FIG. 5, the first and second FPCs 50a, 50b are generally adhered to the image sensor bracket 601 (a component of the image sensor assembly), e.g. in the area δ shown in FIGS. 29A and 29B. In contrast, in the fifth interconnect, the FPCs 50a'', 50b'' are not adhered to the image sensor bracket 601 but instead extend freely to the image sensor PCB 602. This has been shown to decrease the stiffness of the FPCs 50a'', 50b'' in the Z direction by a factor of 75.

In some examples, the interconnect may include only the first set of features (e.g. flexible section γ) or only the second set of features (i.e. not being adhered to the image sensor bracket 601).

In some examples, an interconnect may include the features of the fourth interconnect and (one or both sets of) the features of the fifth interconnect.

These features for reducing Z stiffness may also be included in any of the above described alternative interconnects, e.g. of FIGS. 8 to 13 and 28B.

Electrical Connection of an Autofocus Actuator Arrangement

Figure 16:
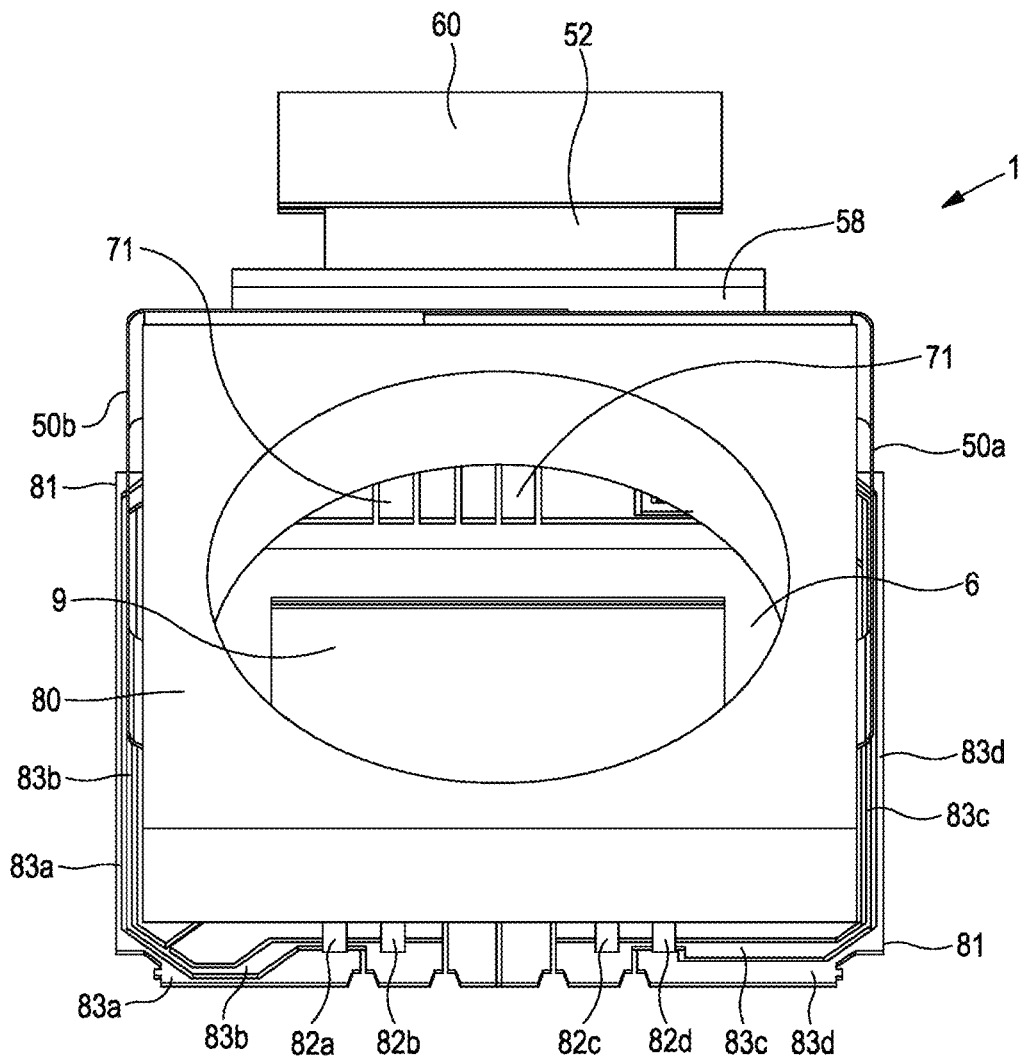
FIG. 16 is a perspective view of part of a camera apparatus.

FIG. 16 is a perspective view of part of the camera apparatus 1. As described above, the lens assembly 20 may comprise a lens carriage 21, on which the lens 22 is supported in a manner allowing movement of the lens 22 along its optical axis O. As shown in FIG. 16, the lens assembly 20 may comprise an autofocus actuator arrangement 80, which may correspond to the axial actuator arrangement 24 shown in FIG. 1. The autofocus actuator arrangement 80 is arranged to move the lens 22 relative to the lens carriage 21 along the optical axis O.

The autofocus actuator arrangement 80 is provided with an electrical connection. The electrical connection may be for connecting the autofocus actuator arrangement 80 to the portable electronic device such as a mobile telephone, or tablet computer. The electrical connection may be for providing power from the device to the autofocus actuator arrangement 80. The electrical connection may be for providing control signals for autofocus.

As described above, optionally a camera connector 60 is provided. The autofocus actuator arrangement 80 may be electrically connected to the camera connector 60. The autofocus actuator arrangement 80 may be electrically connected to the camera connector 60 via part of the FPCs 50. For example, the autofocus actuator arrangement 80 may be electrically connected to one or more of the terminals 61 of the FPCs 50. Alternatively, the electrical connection may be through one or more other FPCs.

Figure 17:
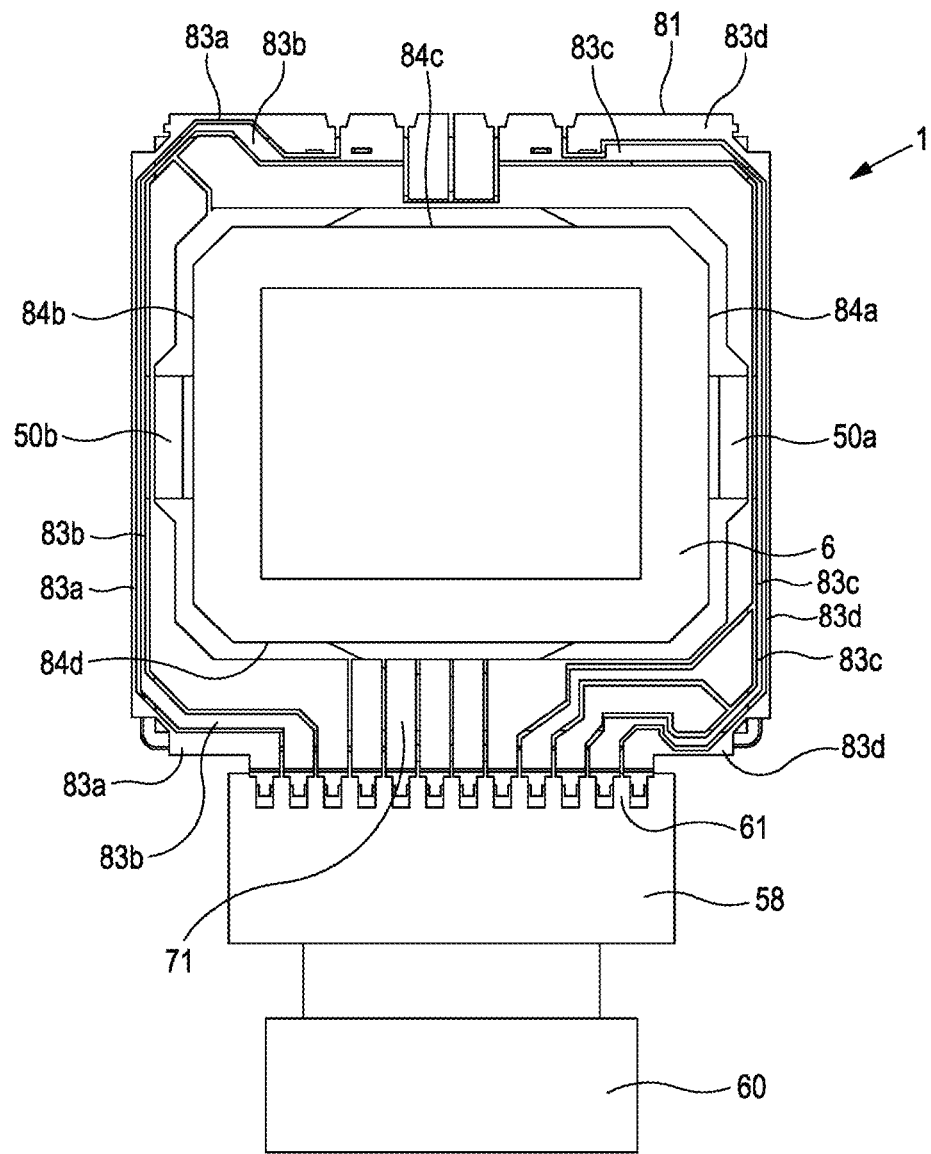
FIG. 17 is a plan view of the camera apparatus shown in FIG. 16.

The autofocus actuator arrangement 80 may be electrically connected to one or more terminals 61 of the FPCs 50 through the support structure 4. This is explained in more detail with reference to FIGS. 16 and 17. FIG. 17 is a plan view of the camera apparatus 1 shown in FIG. 16.

The support structure 4 may comprise a plurality of layers. For example, as shown in FIG. 2 the support structure 4 may comprise a support plate 5 and a rim portion 10 as layers of the support structure 4. As shown in FIGS. 16 and 17, the support structure 4 may comprise a conductor layer 81. The conductor layer 81 comprises electrical conductors. For example, the conductor layer 81 may comprise one or more power lines, control signal lines and/or data lanes 71. The electrical conductors within the conductor layer 81 may be electrically connected to the terminals 61 of the FPCs 50.

The conductor layer 81 may be at substantially the same axial position along the optical axis O as the terminals 61 of the FPCs 50 and/or the camera connector 60. The axial distance between the conductor layer 81 and the image sensor assembly 6 is smaller than the axial distance between the conductor layer 81 and the lens 22. The axial distance between the conductor layer 81 and the image sensor assembly 6 is smaller than the axial distance between the conductor layer 81 and the autofocus actuator arrangement 80. As shown in FIG. 16, optionally the camera apparatus 1 comprises at least one electrical pin 82*a-d*. Each electrical pin 82 is electrically conductive and is configured to provide electrical connection for the autofocus actuator arrangement 80. Optionally, at least one of the electrical pins 82 is for providing power to the autofocus actuator arrangement 80. Optionally, at least one of the electrical pins 82 is for providing control signals to the autofocus actuator arrangement 80.

The electrical pins 82 are configured to extend in the direction of the optical axis O. The electrical pins 82 are configured to electrically connect the autofocus actuator arrangement 80 to the support structure 4, which forms the static part of the sensor shift assembly 2. The electrical pins 82 are arranged to connect the autofocus actuator arrangement 80 to the conductor layer 81 of the support structure 4. Other ways of forming an axial electrical connection between the autofocus actuator arrangement 80 and the support structure will be known to the person skilled in the art.

As shown in FIG. 16, one end of each electrical pin 82 is connected to the autofocus actuator arrangement 80. The other end of each electrical pin 82 is connected to an electrical line (or trace) 83*a-d* in the conductor layer 81. Optionally, each electrical pin 82*a-d* is connected to a respective electrical line 83*a-d*.

In the arrangement shown in FIGS. 16 and 17, the autofocus actuator arrangement 80 is provided with four electrical connections. Four respective electrical pins 82 are connected to four respective electrical lines 83 within the conductor layer 81. However, alternative numbers of electrical connections may be provided. For example, two, three or more than four connections (with respective electrical pins and electrical lines) may be provided.

By providing that the autofocus actuator arrangement 80 is electrically connected through the support structure 4, it is easier to allow the autofocus actuator arrangement 80 to be electrically connected in a way that does not hinder the electrical connection of the sensor shift assembly 2. As shown in FIG. 16, the FPCs 50 may cover the side of the autofocus actuator arrangement 80 that is closest to the camera connector 60. Any FPC or other connector extending outwards from that side of the autofocus actuator arrangement 80 towards the camera connector 60 may physically interfere with the FPCs 50. By forming the connection through the support structure 4, the electrical connection can be formed at a position that does not undesirably interfere with the FPCs 50.

As shown in FIGS. 16 and 17, optionally the autofocus actuator arrangement 80 is electrically connected to the one or more terminals 61 of the FPCs 50 via a route around at least two sides of the image sensor assembly 6. For example, as shown in FIG. 16, the electrical pins 82 may be provided at the opposite side of the image sensor assembly 6 from the terminals 61 of the FPCs 50. The image sensor assembly 6 is disposed between the electrical pins 82 and the terminals 61. Within the conductor layer 81, each electrical line 83*a-d* extends around three sides of the image sensor assembly. For example, as shown in FIG. 17 two of the electrical lines 83*a*, 83*b* may extend along the far side 84*c*, one of the short sides 84*b* and the near side 84*d* of the image sensor assembly 6. As shown in FIG. 17, two other electrical lines 83*c*, 83*d* may extend along the far side 84*c*, one of the short sides 84*a* and the near side 84*d*.

Here, the terms "near" and "far" are relative to the position of the terminals 61 and the camera connector 60. The term "short side" refers to the shorter sides of the rectangular image sensor assembly. In an alternative arrangement, the terminals 61 and the camera connector 60 may be provided near to a short side, in which case the near side and the far side would be short sides and the other two sides would be long sides. As a result, the electrical lines 83*a-d* would extend along the far side, one of the long sides and the near side.

The electrical pins 82 are provided at a different side of the image sensor assembly 6 from the near side 84*d* that is adjacent to the terminals 61 and the camera connector 60. Optionally, the electrical pins 82 are provided at a position where the side of the autofocus actuator arrangement 80 is not covered by the FPCs 50. The electrical pins 82 are distanced from the FPCs in the direction along the sides of the image sensor assembly 6. By providing that the autofocus actuator arrangement 80 is electrically connected to the one or more terminals 61 of the FPCs 50 via a route around at least two sides of the image sensor assembly 6, it is easier to reliably manufacture the camera apparatus 1. In particular, it is possible to access the electrical pins 82 with tools without interference with the FPCs 50. This makes it easier to form the electrical connections for the autofocus actuator arrangement 80 after the image sensor assembly 6 with the FPCs 50 attached has been fixed in place. The increased access to the electrical connections for the autofocus actuator arrangement 80 can increase the reliability of manufacturing the camera apparatus 1.

An embodiment of the invention is expected to facilitate assembly of the FPCs 50 to the image sensor assembly 6 before connecting the autofocus actuator arrangement 80. This improves reliability of manufacture and therefore yield for the camera apparatus 1. The electrical connection between the FPCs 50 and the image sensor assembly 6 may comprise a larger number of connections and/or physically smaller connections compared to the connections for the autofocus actuator arrangement 80. By connecting the FPCs 50 to the image sensor assembly 6 earlier in the manufacturing process, there is more space for tools to handle the FPCs 50 and the image sensor assembly so as to reliably form the connections.

As shown in FIG. 17, optionally different electrical lines 83a-d extend around different sides 84a, 84b of the image sensor assembly 6. This helps to reduce the largest width of space by the sides 84a, 84b required to accommodate the electrical lines 83. However, in an alternative arrangement, all of the electrical lines 83 extend along the same side of the image sensor assembly 6, the side being a side that is perpendicular to the near side 84d.

As shown in FIG. 17, optionally a plurality (and optionally all) of the electrical pins 82 are provided at the same side 84c of the image sensor assembly 6. This can help to reduce the required number of different orientations of the apparatus for assembling and/or testing the electrical pins 82. In turn, this can help to reduce the amount of tooling required, thereby increasing reliability of manufacturing the apparatus.

However, it is not essential for all of the electrical pins 82 to be provided at the same side of the image sensor assembly 6. In an alternative arrangement, electrical pins 82 for connecting to the autofocus actuator arrangement 80 are provided adjacent to at least two sides, and optionally three sides 84a-c of the image sensor assembly 6. As shown in FIGS. 16 and 17, optionally, each electrical line 83 extends around three sides of the image sensor assembly 6. In an alternative arrangement, one or more of the electrical lines may extend around only two sides of the image sensor assembly 6. For example, one or more of the electrical pins 82 may be provided along one of the short sides 84a, 84b of the image sensor assembly 6. The respective electrical lines 83 may extend along only that short side 84a, 84b and the near side 84d so as to connect to the terminals 61. The electrical lines 83 would not be required to extend along the far side 84c of the image sensor assembly. This may help to reduce the length of the electrical lines 83.

Figure 18:
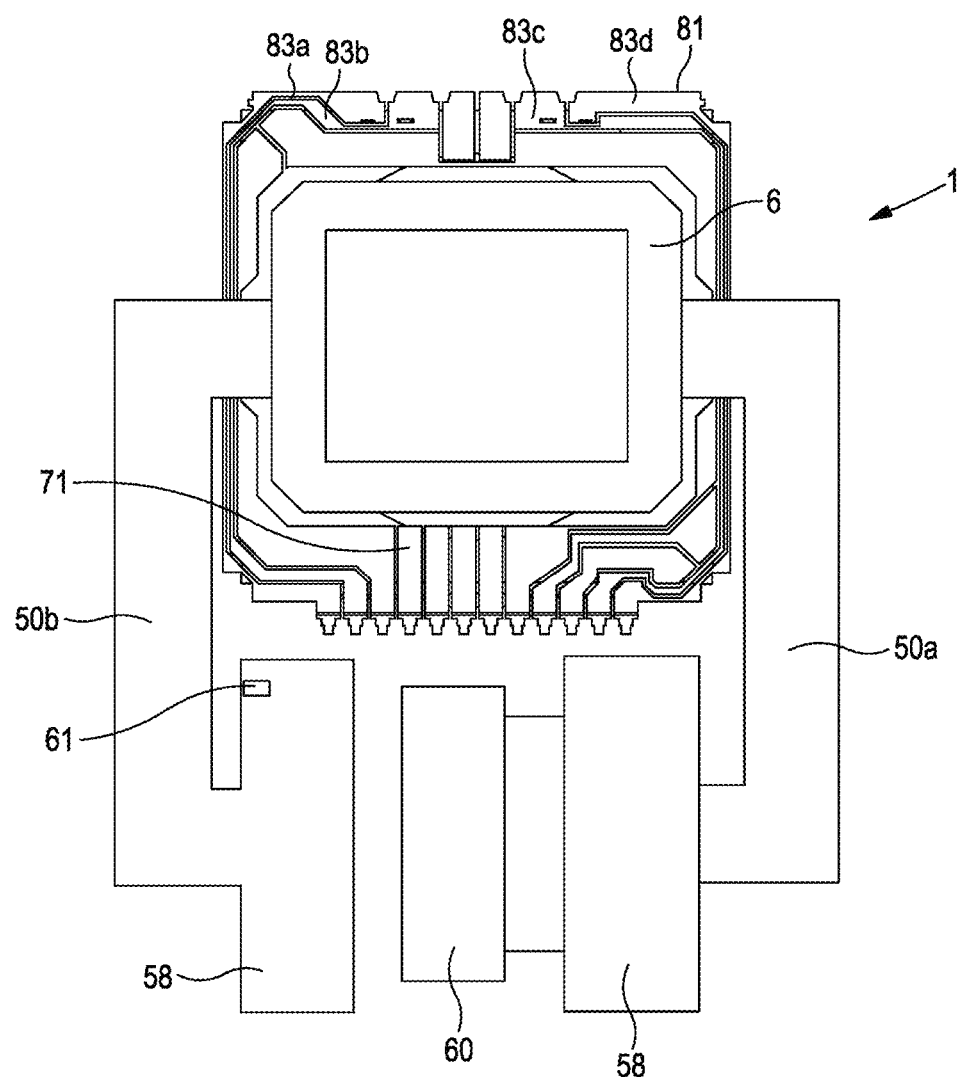
FIG. 18 is a plan view of the camera apparatus shown in FIG. 17 with the flexible printed circuits unfolded.

FIG. 18 is a plan view of the camera apparatus 1 shown in FIG. 17 with the FPCs 50 unfolded. During manufacture of the camera apparatus 1, the FPCs 50 are folded, thereby changing the arrangement from that shown in FIG. 18 to that shown in FIG. 17.

Figure 19:
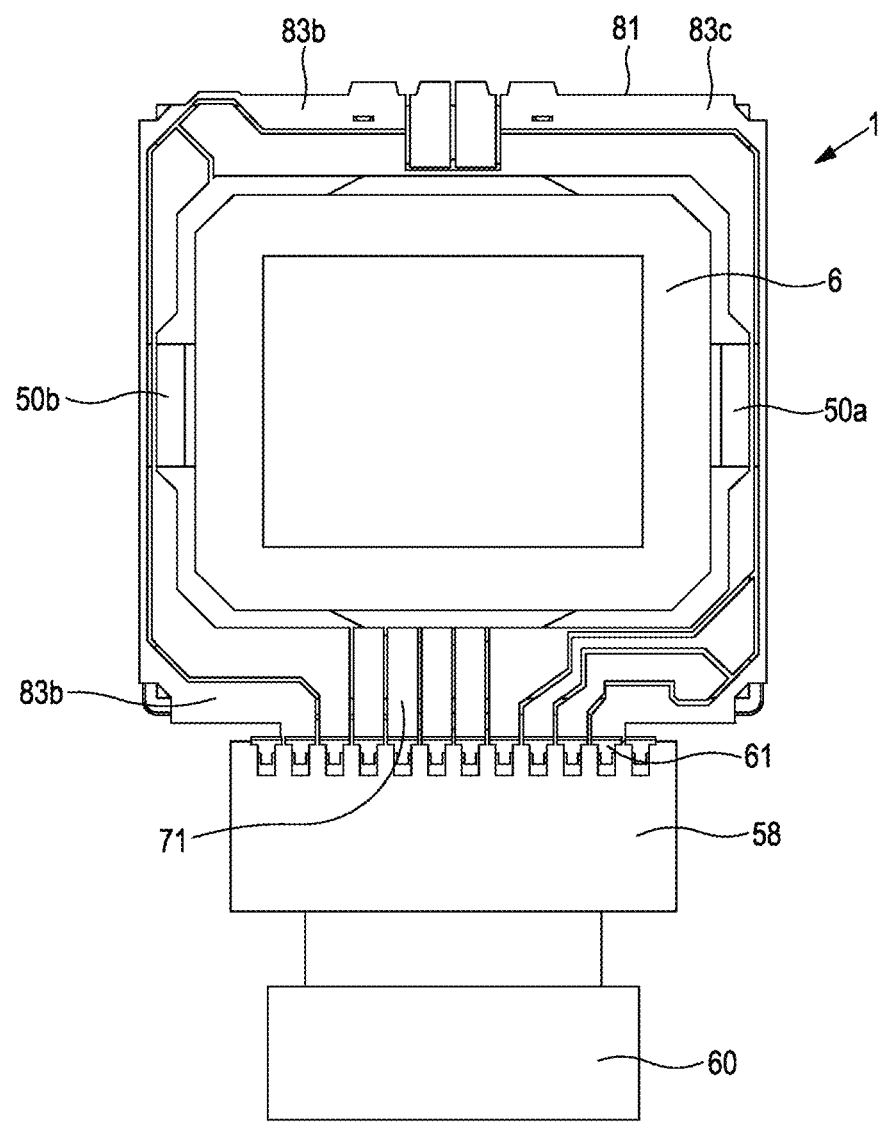
FIG. 19 is a plan view of a camera apparatus.

FIG. 19 is a plan view of a camera apparatus 1. As described above, the lens assembly 20 may comprise a lens carriage 21, on which the lens 22 is supported in the manner allowing movement of the lens 22 along its optical axis O. The lens assembly 20 may comprise an autofocus actuator arrangement 80. The autofocus actuator arrangement 80 is provided with an electrical connection. The electrical connection may be for connecting the autofocus actuator arrangement 80 to the portable electronic device such as a mobile telephone, or tablet computer.

FIG. 19 shows an alternative way of electrically connecting the autofocus actuator arrangement 80 to the camera connector 60. The electrical connection is different from the electrical connection shown in FIGS. 16-18. In particular, FIG. 17 shows electrical lines 83a, 83b extending around one side of the autofocus actuator arrangement 80, and other electrical lines 83c, 83d extending around the other side of the autofocus actuator arrangement 80. In the arrangement shown in FIG. 19, the electrical lines 83a, 83d are moved. The electrical lines 83a, 83d are not provided in the conductor layer 81. As shown in FIG. 19, other electrical lines 83b, 83c may be provided in the conductor layer 81. From a comparison between FIG. 19 and FIG. 17, it can be seen that a reduced number of electrical lines 83 are provided in the conductor layer of the arrangement shown in FIG. 19. By reducing the number of electrical lines 83 provided in the conductor layer 81, the width (in the left-right direction as shown in FIG. 19) of the conductor layer 81 can be reduced. This allows the camera apparatus 1 to be more compact in the direction perpendicular to the optical axis O.

Figure 20:
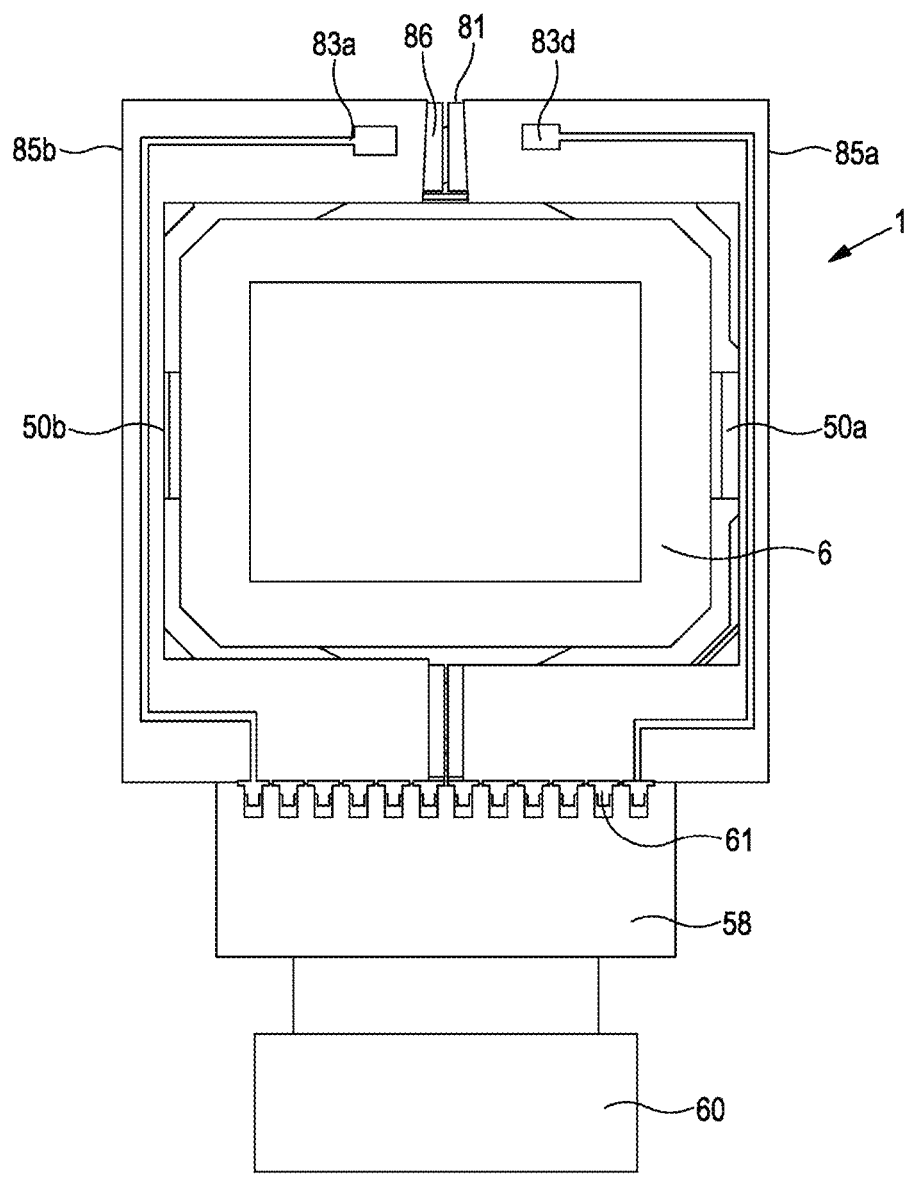
FIG. 20 is a plan view of the camera apparatus shown in FIG. 19.

FIG. 20 is a further plan view of the camera apparatus shown in FIG. 19. As shown in FIG. 20, the camera apparatus 1 may comprise a support layer 85. The support layer 85 is a planar layer parallel to the conductor layer 81. The support layer 85 is configured to provide mechanical support to the conductor layer 81. The support layer 85 is part of the support structure 4.

The support layer 85 may be adjacent to the conductor layer 81. The support layer 85 may be stacked with the conductor layer 81. The support layer 85 may be between the conductor layer 81 and the autofocus actuator arrangement 80 along the direction of the optical axis O. As shown in FIG. 20, the autofocus actuator arrangement 80 may be electrically connected to the one or more terminals 61 through the support layer 85.

FIG. 20 shows the electrical lines 83a, 83d extending through the support layer 85 so as to connect the autofocus actuator arrangement 80 to the terminals 61. The electrical lines 83a, 83d are in addition to the electrical lines 83b, 83c that electrically connect the autofocus actuator arrangement 80 to the terminals 61 through the conductor layer 81, shown in FIG. 19. The autofocus actuator arrangement 80 is electrically connected to the terminals 61 through a plurality of layers 81, 85 of the support structure 4. An embodiment of the invention is expected to achieve a reduction in size of the camera apparatus 1 without reducing the number of electrical connections.

As shown in FIG. 20, the support layer 85 may be provided in two separate portions 85a, 85b. The two portions 85a, 85b are electrically isolated from each other. For example, as shown in FIG. 20, a gap 86 may be provided physically separating the portions 85a, 85b from each other. Each portion 85a, 85b is configured to electrically connect the autofocus actuator arrangement 80 to one of the terminals 61. For example, as shown in FIG. 20, one of the portions 85a may comprise an electrical line 83d that extends around one side of the autofocus actuator arrangement 80, while the other portion 85b comprises another electrical line 83a that extends around the opposite side of the autofocus actuator arrangement 80. The electrical lines 83a, 83d are connected at one end to the autofocus actuator arrangement 80. This end of the electrical lines 83a, 83d may be at the opposite side of the autofocus actuator arrangement 80 from where the terminals 61 are positioned.

From a comparison between the arrangement of FIG. 17 and the arrangement of FIG. 19 and FIG. 20, the two outer electrical lines 83a, 83d have been removed from the conductor layer 81. The support layer 85 is split into two portions 85a, 85b and used to carry the electrical lines 83a, 83d.

Optionally, the support structure 4 comprises a shielding layer (not shown in the figures). The shielding layer may be a further layer stacked on the support layer 85. The shielding layer is configured to electromagnetically shield the conductor layer 81 from the exterior of the camera apparatus 1. In contrast, in the arrangement shown in FIG. 17, it may not be necessary to provide a separate shielding layer in addition to a support layer. This is because the camera apparatus 1 may comprise the shielding layer to provide mechanical support to the conductor layer 81 and the support layer may electromagnetically shield the conductor layer 81 from the exterior of the camera apparatus 1. In the arrangement shown in FIG. 17, the support layer may not be split into two separate portions. This may improve its ability to provide mechanical support.

In an alternative arrangement, the conductor layer 81 may not be required to comprise the electrical lines 83b, 83c. Hence, all electrical lines 83a-83d may be removed from the conductor layer 81. The two further removed electrical lines 83b, 83c may be provided instead in a further support layer 87. The further support layer 87 may be stacked as part of the support structure 4 together with the conductor layer 81 and the support layer 85. This is illustrated in cross-sectional view in FIG. 21.

The further support layer 87 may be a similar structure to the support layer 85 shown in FIG. 20. In particular, the further support layer 87 may be provided in two separate, electrically isolated portions. Each portion may carry one of the electrical lines 83b, 83c.

By providing two support layers 85, 87, the width of the conductor layer 81 can be further reduced. This helps to make the camera apparatus 1 more compact in the directions perpendicular to the optical axis O. The further support layer 87 may combine with the support layer 85 to provide mechanical support to the conductor layer 81. The thicknesses of the support layers 85, 87 may be reduced accordingly. This can help to reduce any potential increase in the size of the camera apparatus 1 in the direction of the optical axis O. For example, in an embodiment the support layer 85 and/or the further support layer 87 may have a thickness of at most 200 µm, optionally at most 100 µm, and optionally at most 50 µm.

The support layer 85 and/or the further support layer 87 may comprise electrically conductive material, for example steel. The support layer 85 and/or the further support layer 87 may be coated in an electrically insulating material. This helps to electrically isolate the electrical lines carried by the support layers 85, 87 from any electrical lines carried in the conductor layer 81. The support layers 85, 87 may be attached to each other and to the conductor layer 81 using an adhesive. The adhesive may be electrically insulating. In contrast, in the arrangement shown in FIG. 17, the support layer may be welded to the support structure 4 as a possible alternative to using an adhesive.

Figure 21:
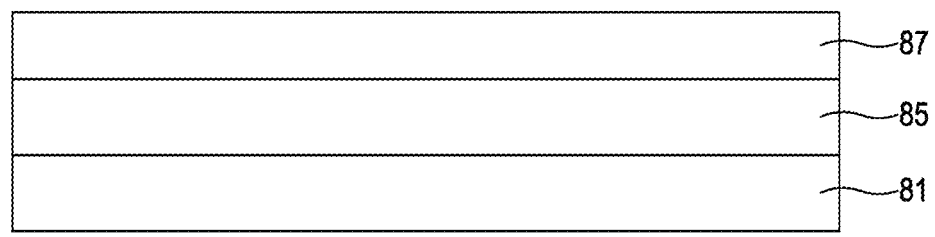
FIG. 21 is a cross-sectional view of part of a camera apparatus.

As shown in FIG. 21, the autofocus actuator arrangement 80 may be electrically connected to the terminals 61 through a plurality of layers 85, 87 of the support structure 4. These layers 85, 87 are layers that are stacked on the conductor layer 81 of the support structure 4. The conductor layer 81 is a layer which comprises data lanes configured to transfer data or power.

Figure 22:
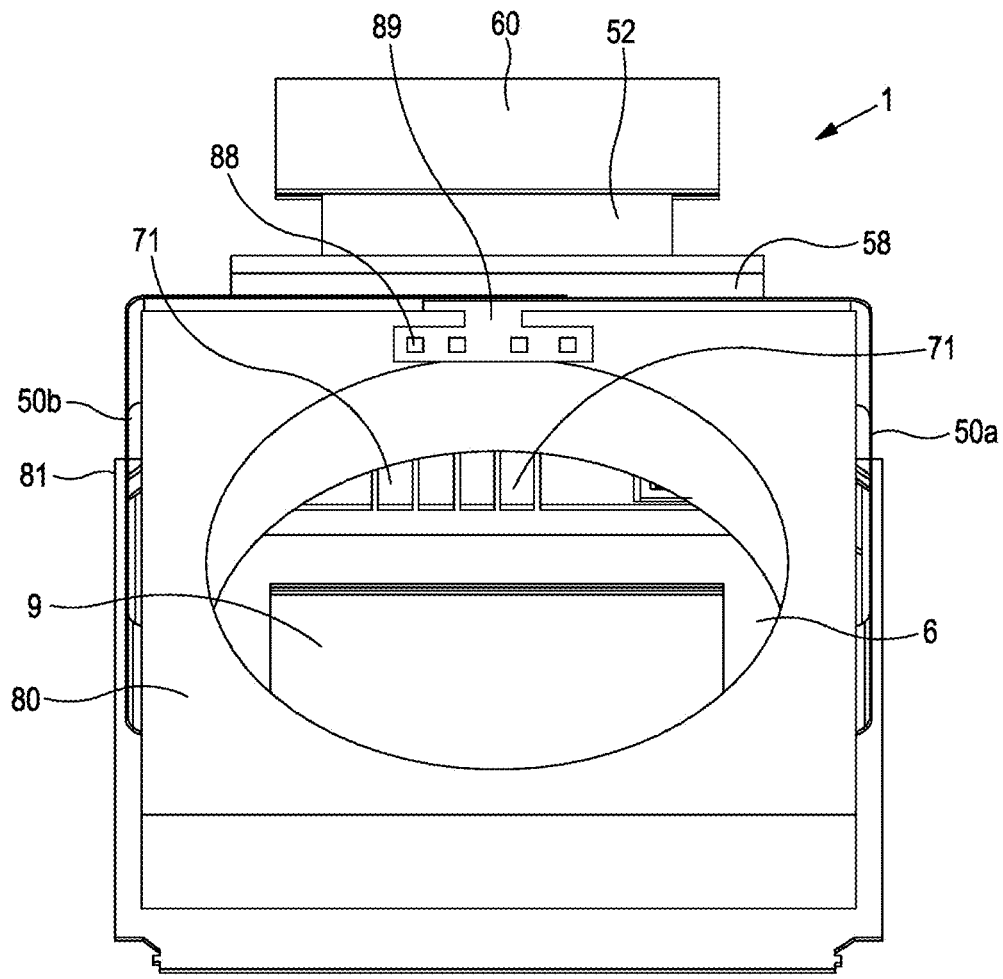
FIG. 22 is a perspective view of a camera apparatus.

FIG. 22 is a perspective view of an alternative arrangement of the camera apparatus 1. The arrangement shown in FIG. 22 is different from the previously described arrangements in that the electrical connection from the autofocus actuator arrangement 80 with the device connector 60 is different. As shown in FIG. 22, one of the flexible printed circuits 50a comprises an arm 89. The arm 89 is electrically connected to the autofocus actuator arrangement 80 such that the autofocus actuator arrangement 80 is electrically connected to the device connector 60 through the arm 89. The arm 89 may be part of the flexible printed circuit 50a that is dedicated for electrical connection to the autofocus actuator arrangement.

As shown in FIG. 22, the arm 89 may extend from one side of the flexible printed circuits 50. In the view shown in FIG. 22, the arm 89 extends from the uppermost side of the flexible printed circuits 50.

As shown in FIG. 22, the arm 89 may extend along a plane perpendicular to the optical axis O, i.e. parallel to the plane in which the light-sensitive region 7 extends. The arm 89 extends in a plane that is at 90 degrees relative to the part of the flexible printed circuits 50 that extends around the edge of the autofocus actuator arrangement 80.

By providing the arm 89, it may not be necessary to provide the electrical lines 83a-83d in the conductor layer 81. This can help to reduce the size of the camera apparatus 1 in the directions perpendicular to the optical axis O. As shown in FIG. 22, the arm 89 may extend across part of the top of the autofocus actuator arrangement 80. As shown in FIG. 20, the arm 89 is electrically connected to the autofocus actuator arrangement 80 at a plurality of connections 88. The connections 88 may correspond to the positions of the terminals of the autofocus actuator arrangement 80. As shown in FIG. 22, the connections 88 may be provided at the top of the autofocus actuator arrangement 80. Alternatively, the terminals of the autofocus actuator arrangement 80 may be provided at the bottom of the autofocus actuator arrangement 80. A further electrical connector such as another flexible printed circuit may be provided connect the terminals at the bottom of the autofocus actuator arrangement 80 to the top of the autofocus actuator arrangement 80, at which point the connections 88 to the arm 89 of the flexible printed circuits 50 can be made.

In a further alternative, the connections 88 may be provided at the side of the autofocus actuator arrangement 80. This can help to reduce any potential increase in the size of the camera apparatus 1 in the direction of the optical axis O.

Figure 23:
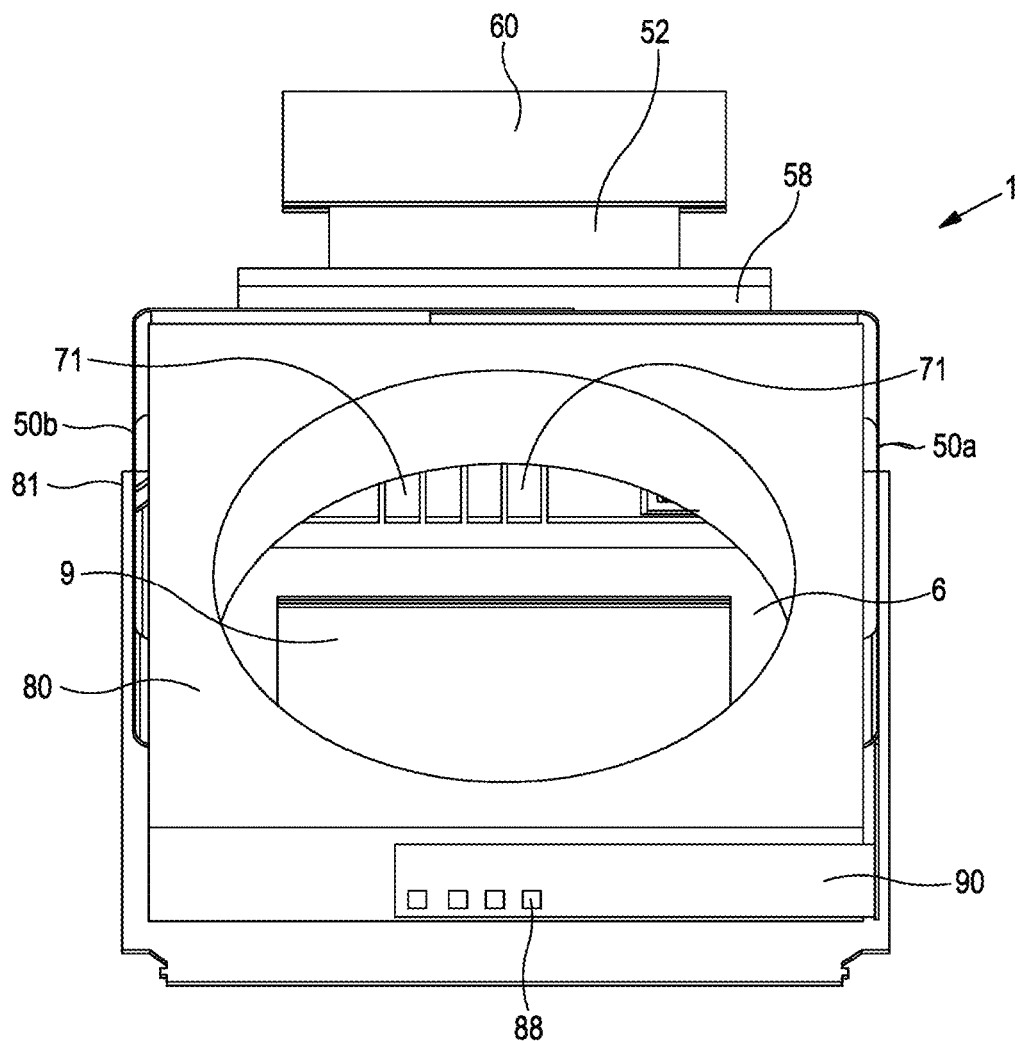
FIG. 23 is a perspective view of a camera apparatus.

FIG. 23 is a perspective view of an alternative arrangement for the camera apparatus 1. In particular, FIG. 23 shows an alternative arrangement for connecting electrically the autofocus actuator arrangement 80 to the device connector 60. As shown in FIG. 23, the flexible printed circuits 50 comprise an arm 90 electrically connected to the autofocus actuator arrangement 80. This is similar to the principle shown in FIG. 22. However, in the arrangement shown in FIG. 23, the arm 90 extends around at least two sides of the image sensor assembly 6. The arm 90 extends around the edges of the autofocus actuator arrangement 80, in a similar manner to the way that the flexible printed circuits 50 extend around the sides of the autofocus actuator arrangement 80.

As shown in FIG. 23, the electrical connections 88 may be provided at the side of the autofocus actuator arrangement 80. The connections 88 may be provided at the opposite side of the autofocus actuator arrangement 80 from where the device connector 60 is positioned. This can help to avoid increasing the size of the camera apparatus 1 in the direction parallel to the optical axis O. As shown in FIG. 23, the arm 90 may comprise a 90 degree turn to the corner of the autofocus actuator arrangement 80. The arm 90 extends in planes that are parallel to the optical axis O. This can help to reduce any constraint that the arm 90 may otherwise provide on the movements required for optical image stabilisation.

In the arrangement shown in FIG. 23, the arm 90 is an extension of the flexible printed circuit 50a. The electrical connections for the autofocus actuator arrangement 80 are dependent on the flexible printed circuit 50a.

Figure 24:
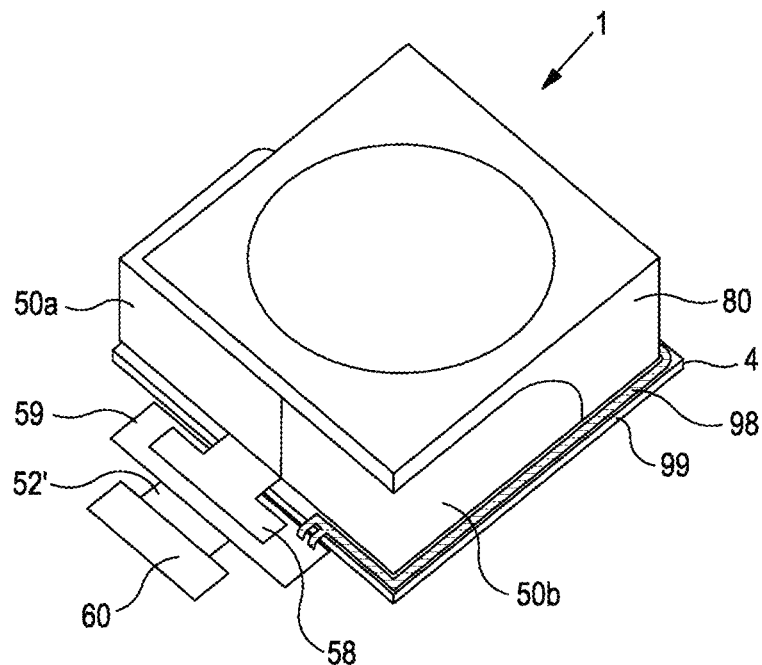
FIG. 24 is a perspective view of a camera apparatus.
Figure 25:
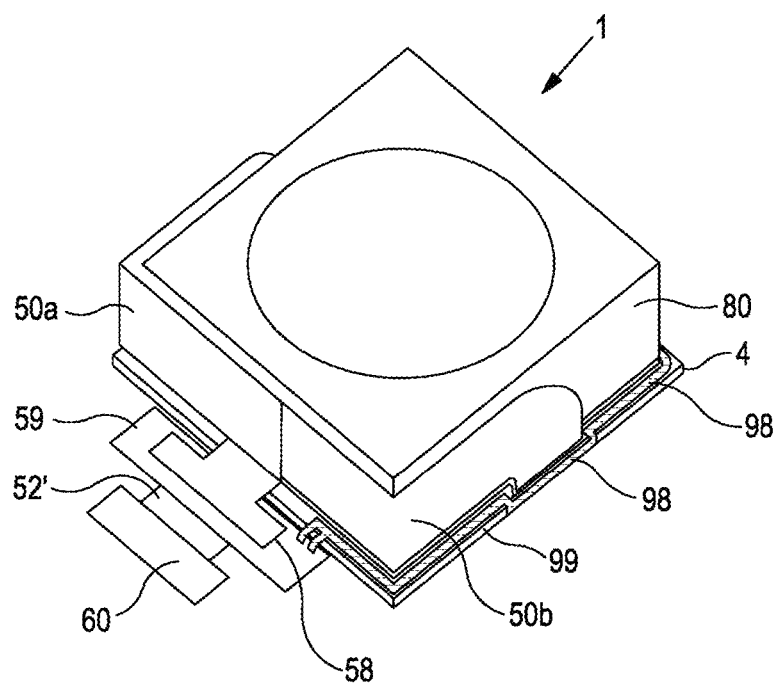
FIG. 25 is a perspective view of a camera apparatus.

FIG. 24 is a perspective view of an alternative arrangement for the camera apparatus 1. For example, as shown in FIG. 24 a further flexible printed circuit 98 may be provided that extends around the edges of the autofocus actuator arrangement 80 without being electrically connected to the flexible printed circuits 50a, 50b. The further flexible printed circuit 98 can be independent of the flexible printed circuits used for power/data for the image sensor assembly 6. As shown in FIGS. 24 and 25, the further flexible printed circuit 98 may be connected to a PCB 59 which, in turn, may be connected via a flexible printed circuit 52' to the device connector 60. The flexible printed circuits 50a, 50b may terminate at the increased-width section 58, which may also be connected to the PCB 59. The further flexible printed circuit 98 may be provided between the flexible printed circuit 50a and the autofocus actuator arrangement 80. Alternatively, as shown in FIG. 24 the flexible printed circuit 50a may be provided between the further flexible printed circuit 98 and the autofocus actuator arrangement 80.

Optionally, as shown in FIG. 24 the further flexible printed circuit 98 for providing electrical connection to the autofocus actuator arrangement 80 is attached to the support layer described above. For example, the further flexible printed circuit 98 may be attached to the support layer by an adhesive. As shown in FIG. 24 further flexible printed circuits 98 may extend in a plane parallel to the support layer. Additionally or alternatively, as shown in FIG. 25 part of the further flexible printed circuit 98 may extend in a plane parallel to the optical axis O. As can be seen from, for example, FIG. 20, the amount of available space on the support layer around the sides of the image sensor assembly 6 may be limited. If there is not enough space for the further flexible printed circuit 98 (e.g. due to the flexible printed circuits 50a, 50b), then as shown in FIG. 25 the further flexible printed circuit 98 may be routed along the side 99 of the support structure 4.

Optionally, as shown in FIG. 24 the further flexible printed circuit 98 is fully overlapped by the support structure 4 when viewed along an axis orthogonal to the plane in which the light-sensitive region 7 extends. The further flexible printed circuit 98 may not add any extra size to the camera apparatus 1 in the directions perpendicular to the optical axis O.

Figure 26:
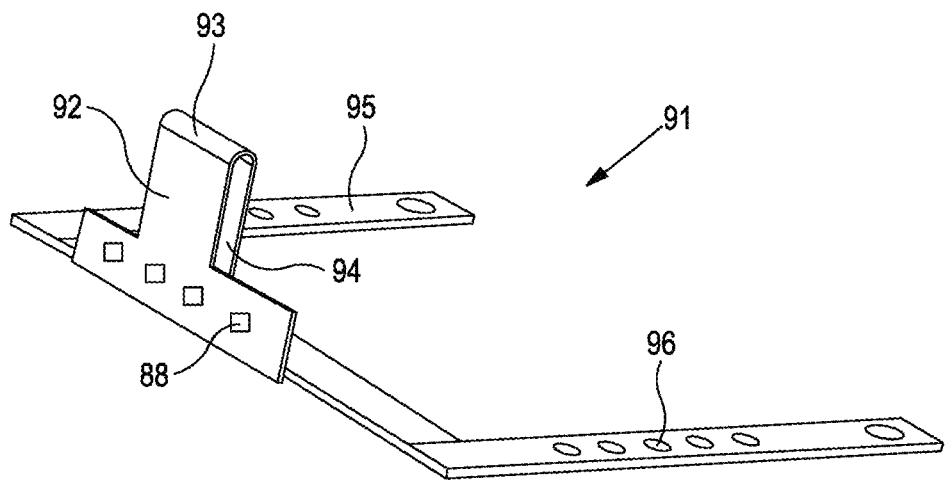
FIG. 26 is a perspective view of part of a camera apparatus.

FIG. 26 is a perspective view of part of a camera apparatus 1 according to an alternative arrangement. FIG. 26 shows a printed circuit 91. The printed circuit 91 is for carrying electrical connections from the autofocus actuator arrangement 80. The printed circuit 91 is connected to the autofocus actuator arrangement 80 via the connections 88. The connections 88 may be at the same side of the image sensor assembly 6 as the terminals 61. The printed circuit 91 is for connecting to the terminals 61 of the device connector 60.

As shown in FIG. 26, the printed circuit 91 comprises a bend 93. The bend 93 is configured to be positioned around an edge of at least one of the flexible printed circuits 50. The bend 93 is a connecting portion between two planar portions 92, 94. At least one of the flexible printed circuits 50 is arranged to extend through the gap between the planar portions 92, 94. Accordingly, the autofocus actuator arrangement 80 may be electrically connected to the terminals 61 of the printed circuits 50 through a printed circuit 91 comprising a bend 93 around an edge of at least one of the flexible printed circuits 50. The printed circuit 91 may comprise electrical lines extending from the connections 88, along the planar portion 92, around the bend 93, along the planar portion 94 and along one or more side arms 95 to connectors 96. The connectors 96 may be electrically connected to the terminals 61. Optionally, both of the planar portions 92, 94 are provided radially inward of the can 15 (shown in FIG. 1). Alternatively, the can 15 may pass between the planar portions 92, 94. The bend 93 may bend around the edge of the can 15 in addition to bending round the edge of the flexible printed circuits 50.

It may be that the connections 88 between the printed circuit 91 and the autofocus actuator arrangement 80 are covered by at least one of the flexible printed circuits 50. This can make it difficult to provide a simple electrical connection between the device connector 60 and the autofocus actuator arrangement 80. By providing the printed circuit 91 with a bend 93, the electrical connection can be achieved relatively simply.

Figure 27:
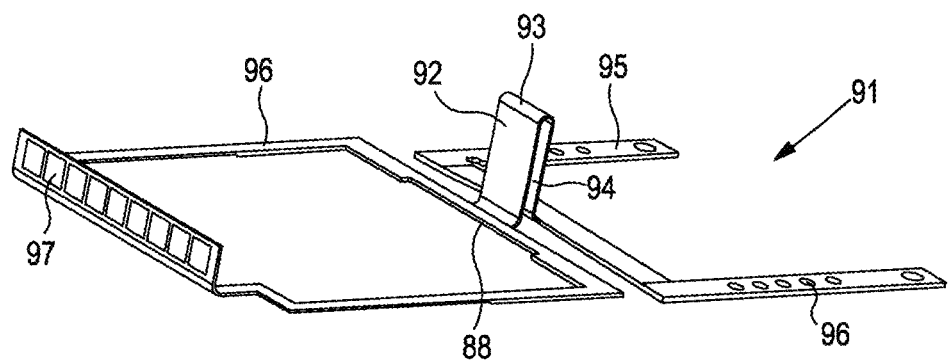
FIG. 27 is a perspective view of part of a camera apparatus.

FIG. 27 is a perspective view of a modified version of the printed circuit 91 shown in FIG. 26. As shown in FIG. 27, optionally the printed circuit 91 further comprises one or more further terminals 97. The further terminals 97 are connected to the connections 88 that are between the printed circuit 91 and the autofocus actuator arrangement 80. As shown in FIG. 27, the further terminals 97 are at the opposite side of the autofocus actuator arrangement 80 from the connections 88. Electrical connection between the further terminals 97 and the connections 88 is provided through one or more side arms 96 extending around the edges of the image sensor assembly 6. The further terminals 97 are in addition to the terminals of the device connector 60. Electrical connection to the autofocus actuator arrangement 80 is thus provided at both sides of the camera apparatus 1. For example, it may be that the further terminals 97 are used during manufacture of the camera apparatus 1. Meanwhile, the electrical connections to the device connector 60 are used once the camera apparatus 1 has been manufactured and electrical connection to the device is required.

Optionally, the lens assembly comprises a lens actuator arrangement arranged to move the lens perpendicular to the optical axis O. Hence, there may be a lens shift mechanism, which may provide optical image stabilisation. The optical connections for the lens shift can be provided through the same means as the electrical connections for controlling the autofocus. In particular, electrical connections may be routed in a similar way to as shown in FIGS. 16-27.

Further Details of the Camera Apparatus

The arrangement of the plain bearing 100 will now be described. In this example, the plain bearing 100 comprises a first bearing surface 101 on the carrier 8, in particular being the lower surface of the moving plate 9, and a second bearing surface 102 on the support structure 4, in particular being the upper surface of the support plate 5. In this example, bearing surfaces 101 and 102 are each planar. The bearing surfaces 101 and 102 bear on each other and thereby suspend the carrier 8 on the support structure 4. Since the bearing surfaces 101 and 102 may slide relative to each other, they allow movement of the image sensor assembly 6 in any direction laterally to the light-sensitive region 7 and further allow rotation of the image sensor assembly about an axis orthogonal to the light-sensitive region 7.

The plain bearing 100 not only suspends the image sensor assembly 6, but also facilitates heat transfer from the image sensor assembly 6 to the support structure 4. This is because the bearing surface surfaces 101 and 102 provide a continuous region of thermally conductive material without an air gap. This provides a path having good thermal conductivity for dissipating heat from the image sensor assembly 6, as well as providing the requisite suspension. This allows the support structure 4 to act as a heat sink for the image sensor assembly 6.

Heat transfer from the image sensor assembly 6 is further facilitated by forming the moving plate 9 and support plate 5 from materials having a high thermal conductivity, for example metal.

In the illustrated example, a single plain bearing 100 is provided between the support plate 4 and the carrier 8. In this example, the plain bearing 100 has a rectangular area of contact between the bearing surfaces 101 and 102. However, in general, the area of contact may be varied and/or plural plain bearings 100 may be provided.

In the case of providing a single plain bearing 100, the area of contact 110 of the plain bearing 100 may have shapes other than rectangular. By way of example the area of contact 110 may have a circular shape, which may be easier to manufacture and/or assist in providing a balanced bearing contact.

The alternative of providing plural plain bearings 100 may assist in manufacture and/or assist in providing a balanced bearing contact. Typically at least three plain bearings may be used to provide a stable contact.

The total area of contact of the bearing surfaces 101 and 102 of the plain bearing 100 (being the total area of all the plain bearings 100 if more than one is provided) is chosen to control the friction and the thermal conductivity. In general, there is a balance between reducing friction by minimising the total area and increasing thermal conductivity by maximising the total area.

The material properties of the bearing surfaces 101 and 102 are chosen to provide a low friction and low wear plain bearing. With regard to reducing friction, the bearing surfaces 101 and 102 may be designed to have a coefficient of friction of 0.2 or less.

The bearing surfaces 101 and 102 may each be made from the same material as the element on which it is formed, for example the support plate 5 or moving plate 9. That material may be selected to provide suitable properties.

A fluid 103 may be disposed between the bearing surfaces 101 and 102, as shown in the illustrated examples. The material properties of the fluid 103 if provided are selected to provide lubrication between the bearing surfaces 101 and 102 so that the coefficient of friction between the bearing surfaces 101 and 102 is reduced and/or to have a thermal conductivity that improve the thermal contact between the bearing surfaces 102 and 103. For example, the fluid 103 may be a grease.

However, the fluid 103 is optional. As an alternative to providing the fluid 103, the bearing surfaces 101 and 102 may be in direct contact. Depending on the material properties of the bearing surfaces 101 and 102 and/or coatings thereon, this may provide a coefficient of friction and a thermal contact that is sufficient.

In addition, the sensor shift assembly 2 comprises two flexures 67 connected between the support structure 4 and the carrier 8 to act as a biasing arrangement that biases the bearing surfaces 101 and 102 together, as well as providing an electrical connection to the image sensor assembly 6. In this example, the flexures 67 are formed integrally with the moving plate 9 at one end 68 thereof and are mounted to support plate 5 of the support structure 4 at the other end 69 thereof. Alternatively, the flexures 67 could be formed integrally with a plate of the support structure 4 and mounted to the carrier, or else could be separate elements mounted to each of the support structure 4 and the carrier 8. In any of these examples, the mounting of the flexures 67 may be achieved e.g. by soldering which provides both mechanical and electrical connection.

The flexures 67 are arranged as follows to provide their mechanical function. Each flexure 67 is an elongate beam connected between the support structure 4 and carrier 8. The flexures 67, due to their intrinsic resilience, bias the support structure 4 and the carrier 8 together, the biasing force being applied parallel to the optical axis O. This maintains the contact between the bearing surfaces 101 and 102 of the plain bearing 100. At the same time, the flexures 67 may be laterally deflected to permit lateral movement and rotation of the image sensor assembly 6 relative to the support structure 4 to permit the OIS function.

The flexures 67, again due to their intrinsic resilience, also provide a lateral biasing force that biases the image sensor assembly 6 towards a central position aligned with the optical axis O of the lens assembly 20 from any direction around that central position. As a result, in the absence of driving of the SMA actuator wires 40, the image sensor assembly 6 will tend towards the central position. This ensures that the camera apparatus 1 remains functional to capture images, even in the absence of driving of the SMA actuator wires 40.

The flexures 67 are designed as follows to provide a suitable retaining force along the optical axis O for the plain bearing 100, and also to permit lateral movement with a lateral biasing force. The magnitude of the lateral biasing force is kept low enough as not to hinder OIS, whilst being high enough to centre the image sensor assembly 6 in the absence of driving. Each flexure 67 has a cross-section with an average width orthogonal to the optical axis O is that is greater than its average thickness parallel to the optical axis O. Each flexure 67 extends in an L-shape around the optical axis O, it in general being desirable that the angular extent is at least 90° as measured between the ends of the flexure 67.

In the assembled state of the sensor shift assembly 2, the flexures 67 are deflected from their relaxed state to provide a pre-loading force that biases the support structure 4 and the carrier 8 together.

The flexures 67 are made of a suitable material that provides the desired mechanical properties and is electrically conductive. Typically, the material is a metal having a relatively high yield, for example steel such as stainless steel.

Movement of the image sensor assembly 6 relative to the support structure 4 is driven by a lateral actuator arrangement that is arranged as follows, and seen most easily in FIG. 4. The lateral actuator arrangement is formed by a total of four SMA actuator wires 40 connected between the support structure 4 and the carrier 8. For attaching the SMA actuator wires 40, the carrier 8 comprises crimp portions 41 fixed to the moving plate 9 and the support structure 4 comprises crimp portions 42 fixed to the rim portion 10. The crimp portions 41 and 42 crimp the four SMA actuator wires 40 so as to connect them to the support structure 4 and the carrier 8. The crimp portions 41 fixed to the moving plate 9 are formed integrally from a sheet of metal so as to electrically connect the SMA actuator wires 40 together at the carrier 8.

Although in this example the crimp portions 41 and 42 are separate elements fixed to the moving plate 9 and the rim portion 10, as an alternative the crimp portions 41 could be formed integrally with the moving plate 9 and/or the crimp portions 42 could be formed integrally with the support plate 5.

The SMA actuator wires 40 are arranged as follows so that they are capable, on selective driving, of moving the image sensor assembly 6 relative to the support structure 4 in any direction laterally to the light-sensitive region 7 and also of rotating the image sensor assembly 6 about an axis orthogonal to the light-sensitive region 7.

Each of the SMA actuator wires 40 is held in tension, thereby applying a force between the support structure 4 and the carrier 8.

The SMA actuator wires 40 may be perpendicular to the optical axis O so that the force applied to the carrier 8 is lateral to the light-sensitive region 7. Alternatively, the SMA actuator wires 40 may be inclined at a small angle to the light-sensitive region 7 so that the force applied to the carrier 8 includes a component lateral to the light-sensitive region 7 and a component along the optical axis O that acts as a biasing force that biases the bearing surfaces 101 and 102 of the plain bearing 100 together.

The overall arrangement of the SMA actuator wires 40 will now be described, being similar to that described in WO-2014/083318, except that they are connected to the carrier 8 for moving the image sensor assembly 6, not to the lens assembly 20.

SMA material has the property that on heating it undergoes a solid-state phase change which causes the SMA material to contract. At low temperatures, the SMA material enters the Martensite phase. At high temperatures, the SMA enters the Austenite phase which induces a deformation causing the SMA material to contract. The phase change occurs over a range of temperature due to the statistical spread of transition temperature in the SMA crystal structure. Thus heating of the SMA actuator wires 40 causes them to decrease in length.

The SMA actuator wires 40 may be made of any suitable SMA material, for example Nitinol or another Titanium-alloy SMA material. Advantageously, the material composition and pre-treatment of the SMA actuator wires 40 is chosen to provide phase change over a range of temperature that is above the expected ambient temperature during normal operation and as wide as possible to maximise the degree of positional control.

On heating of one of the SMA actuator wires 40, the stress therein increases and it contracts, causing movement of the image sensor assembly 6. A range of movement occurs as the temperature of the SMA increases over the range of temperature in which there occurs the transition of the SMA material from the Martensite phase to the Austenite phase. Conversely, on cooling of one of the SMA actuator wires 40 so that the stress therein decreases, it expands under the force from opposing ones of the SMA actuator wires 40. This causes the image sensor assembly 6 to move in the opposite direction.

The carrier 8 and the image sensor assembly 6 are positioned axially within the aperture 11 of the rim portion 10 of the support structure 4. The four SMA actuator wires 40 are arranged on four sides of the image sensor assembly 6. The SMA actuator wires 40 are of the same length and have a rotationally symmetrical arrangement.

As viewed axially, a first pair of the SMA actuator wires 40 extend parallel to a first axis (vertical in FIG. 4) that is lateral to the light-sensitive region 7. However, the first pair of the SMA actuator wires 40 are oppositely connected to the support structure 4 and the carrier 8 so that they apply forces in opposite directions along the first axis (vertically up and down in FIG. 4). The forces applied by the SMA actuator wires 40 of the first pair balance in the event that the tension in each SMA actuator wire 40 is equal. This means that the first pair of the SMA actuator wires 40 apply a first torque to the image sensor assembly 6 (anti-clockwise in FIG. 4).

As viewed axially, a second pair of SMA actuator wires 40 extend parallel to a second axis (horizontal in FIG. 4) that is lateral to the light-sensitive region 7. However, the second pair of SMA actuator wires 40 are oppositely connected to the support structure 4 and the carrier 8 so that they apply forces in opposite directions along the second axis (horizontally left and right in FIG. 4). The forces applied by the SMA actuator wires 40 of the second pair balance in the event that the tension in each SMA actuator wire 40 is equal. This means that the second pair of the SMA actuator wires 40 apply a second torque (clockwise in FIG. 3) to the image sensor assembly 6 that is arranged to be in an opposite sense to the first torque. Thus, the first and second torques balance in the event that tension in each SMA actuator wire 40 is the same.

As a result, the SMA actuator wires 40 may be selectively driven to move the image sensor assembly 6 in any direction laterally and to rotate the image sensor assembly 6 about an axis parallel to the optical axis O. That is:

movement of the image sensor assembly 6 in either direction along the first axis may be achieved by driving the first pair of SMA actuator wires 40 to contract differentially, due to them applying forces in opposite directions;

movement of the image sensor assembly 6 in either direction along the second axis may be achieved by driving the second pair of SMA actuator wires 40 to contract differentially, due to them applying forces in opposite directions; and rotation of the image sensor assembly 6 may be achieved by driving the first pair of SMA actuator wires 40 and the second pair of SMA actuator wires 40 to contract differentially, due to the first and second torques being in opposite senses.

The magnitude of the range of movement and rotation depends on the geometry and the range of contraction of the SMA actuator wires 40 within their normal operating parameters.

This particular arrangement of the SMA actuator wires 40 is advantageous because it can drive the desired lateral movement and rotation with a minimum number of SMA actuator wires. However, other arrangements of SMA actuator wires 40 could be applied. To provide three degrees of motion (two degrees of lateral motion and one degree of rotational motion), then a minimum of four SMA actuator wires 40 are provided. Other arrangements could apply a different number of SMA actuator wires 40. Less SMA actuator wires 40 could be provided for lateral motion, but not rotation. Arrangements with more than four SMA actuator wires 40 are also possible, and may have advantages in allowing additional parameters to be controlled in addition to motion, for example the degree of stress in the SMA actuator wires 40.

The lateral position and orientation of the image sensor assembly 6 relative to the support structure 4 is controlled by selectively varying the temperature of the SMA actuator wires 40. This driving of the SMA actuator wires 40 is achieved by passing selective drive signals through the SMA actuator wires 40 to provide resistive heating. Heating is provided directly by the current of the drive signals. Cooling is provided by reducing or ceasing the current of the drive signals to allow the SMA wire 40 to cool by conduction, convection and radiation to its surroundings.

The camera apparatus 1 comprises a lens assembly 20 that is assembled with the sensor shift assembly 2 by being mounted to the support structure 4, in particular to the rim portion 10.

The lens assembly 20 comprises a lens carriage 21 in the form of a cylindrical body that is mounted to the rim portion 10 of the support structure 4. The lens carriage supports at least one lens 22 arranged along the optical axis O. In general any number of one or more lenses 22 may be provided. Without limitation to the invention, in this example the camera apparatus 1 is a miniature camera in which the at least one lens 22 (i.e. each lens 22 if plural lenses are provided) typically have a diameter of at most 10 mm or 15 mm or 20 mm. The at least one lens 22 of the lens assembly 20 is arranged to focus an image onto the image sensor.

In this example, at least one lens 22 is supported on the lens carriage 21 in a manner in which at least one lens 22 is movable along the optical axis O relative to the lens carriage 21, for example to provide focusing or zoom, although that is not essential. In particular, the at least one lens 22 is fixed to a lens holder 23 which is movable along the optical axis O relative to the lens carriage 21. Where there are plural lenses 22, any or all of the lenses 22 may be fixed to the lens holder 23 and/or one or more of the lenses 22 may be fixed to the lens carriage 21 and so not movable along the optical axis O relative to the lens carriage 21.

An axial actuator arrangement 24 provided between the lens carriage 21 and the lens holder 23 is arranged to drive movement of the lens holder 21 and lenses 22 along the optical axis O relative to the lens carriage 21. The axial actuator arrangement 24 may be any suitable type, for example being a voice coil motor (VCM) or an arrangement of SMA actuator wires, such as is described in WO-2019/243849 which is incorporated herein by reference.

In addition, the camera apparatus 1 may comprise a can 15 fixed to the support structure 4 and protruding forwardly therefrom to encase and protect the other components of the camera apparatus 1.

As discussed above, in operation the SMA actuator wires 40 are selectively driven to move the image sensor assembly 6 in any direction laterally and/or to rotate the image sensor assembly 6 about an axis parallel to the optical axis O. This is used to provide OIS, compensating for image movement of the camera apparatus 1, caused by for example hand shake.

Relative movement of the image sensor relative to the support structure 4 and hence also relative to the lens assembly 20 may be used to stabilise the image against tilting of the camera apparatus 1, i.e. rotation about axes extending laterally to the light-sensitive region 7. This occurs in a similar manner to a camera apparatus providing OIS-lens shift of the type disclosed in WO-2013/175197 and WO-2014/083318 which also involves relative lateral movement of the image sensor and lens assembly 20. In addition, rotation of the image sensor may be used to stabilise the image against rotation of the camera apparatus 1 around the optical axis O. This type of stabilisation is not achieved by a camera apparatus providing OIS-lens shift of the type disclosed in WO-2013/175197 and WO-2014/083318.

The SMA actuator wires 40 are driven by the control circuit implemented in the IC chip 30. In particular, the control circuit generates drive signals for each of the SMA actuator wires 40 and supplies the drive signals to the SMA actuator wires 40.

The control circuit 30 receives the output signals of the gyroscope sensor 31 which acts as a vibration sensor. The gyroscope sensor 31 detects the vibrations that the camera apparatus 1 is experiencing and its output signals represent those vibrations, specifically as the angular velocity of the camera lens element 20 in three dimensions. The gyroscope sensor 31 is typically a pair of miniature gyroscopes, for detecting vibration around three axes, being two axes laterally of the light-sensitive region 7 and also the optical axis O. More generally, larger numbers of gyroscopes or other types of vibration sensor could be used.

The drive signals are generated by the control circuit in response to the output signals of the gyroscope sensor 31 so as to drive movement of the image sensor assembly 6 to stabilise an image focused by the camera lens element 20 on the image sensor, thereby providing OIS. The drive signals may be generated using a resistance feedback control technique for example as disclosed in any of WO-2013/175197, WO-2014/076463, WO-2012/066285, WO-2012/020212, WO-2011/104518, WO-2012/038703, WO-2010/089529 or WO-2010/029316, each of which is incorporated herein by reference.

As described above, the camera apparatus 1 may be incorporated into a portable electronic device, such as such as a mobile telephone or tablet computer. There is thus provided a portable electronic device comprising the camera apparatus 1. The portable electronic device may comprise a processor. Super-resolution imaging may be provided in the camera apparatus 1 and/or the portable electronic device. Super-resolution imaging is achieved, for example, by combining two or more images that are captured at positions offset from one another by a sub-pixel distance.

For this purpose, the image sensor assembly 6 is controllably moved between two or more positions that are offset from each other, in a direction parallel to the light-sensitive region 7, by a sub-pixel distance. Light that falls onto a centre of a pixel at one position (and so may be used to capture an image) thus falls between pixels at another position. The control circuit may drive the SMA actuator wires 40 so as to controllably move the image sensor assembly 6 in this manner. A sub-pixel distance is a distance that is less than a pixel pitch of the light-sensitive region 7. The pixel pitch refers to the distance between the centres of two adjacent pixels.

The image sensor assembly 6 may be controllably moved to a positional accuracy of 0.5 µm or smaller. Particular advantage is achieved in the case that the lateral actuator arrangement comprises plural SMA actuator wires 40, as SMA provides a high actuation force compared to other forms of actuator. This may assist in accurate positioning of the image sensor assembly 6 relative to the support structure 2.

The two or more positions may be stationary positions, so the image sensor assembly 6 may stop at each of the two or more positions before moving on to the next of the two or more positions. The two or more positions may be offset from one another in a direction along a pixel row and/or along a pixel column of the light-sensitive region 7. The two or more positions may comprise i) one or more positions that are offset from a starting position by a sub-pixel distance along a pixel row, and ii) one or more positions that are offset from a starting position by a sub-pixel distance along a pixel column. Optionally, the two or more positions may comprise one or more positions that are offset from a starting position by a sub-pixel distance along a pixel row and along a pixel column.

Images are captured at each of the two or more positions using the image sensor. A controller may control the image sensor so as to capture the images. The controller may be implemented as part of the control circuit on the IC chip 30 or as part of another circuit on the IC chip 30. Alternatively, the controller may be implemented as part of another IC that forms part of the camera apparatus 1. Further alternatively, the controller may be implemented as part of the processor that forms part of the portable electronic device.

The images may then be combined so as to form a super-resolution image, for example using the processor of the portable electronic device or the above-described controller. The super-resolution image has a resolution that is greater than the resolution of the individual images that are captured by the image sensor. For example, the two or more images may be combined by interleaving the two or more images.

Other Variations

It will be appreciated that there may be many other variations of the above-described embodiments.

For example, the above-described FPCs may be used in an OIS-module-tilt camera apparatus as described in WO-2010/029316 or WO-2010/089529, each of which is incorporated herein by reference. Such a camera apparatus has a camera unit incorporating an image sensor assembly and a lens carriage. The camera unit is tiltable relative to a support structure around two axes (e.g. X and Y) that are perpendicular to each other and to a primary axis passing through the camera apparatus. At least some of the above-described advantages, e.g. less hindrance of the movement of the image sensor assembly during OIS, can be achieved by using the above-described FPCs to connect to the image sensor assembly comprised in the tiltable camera unit.

The term shape memory alloy (SMA) actuator wire may refer to any suitably-shaped element comprising SMA. The SMA actuator wire may be elongate and may have a round cross section or any other shape cross section. The cross section may vary along the length of the SMA actuator wire. It is also possible that the length of the SMA actuator wire (however defined) may be similar to one or more of its other dimensions. The SMA actuator wire may be flexible. Accordingly, when connected between two elements, the SMA actuator wire may only be able to apply a force that urges the two elements together, this force being applied when the SMA actuator wire is in tension. Alternatively, the SMA actuator wire may be beam-like or rigid. The SMA actuator wire may or may not include material(s) and/or component(s) that are not SMA.

The invention claimed is:

1. An actuator assembly comprising:
a support structure;
an image sensor assembly comprising an image sensor having a light-sensitive region, the image sensor assembly being suspended on the support structure in a manner allowing movement of the image sensor assembly relative to the support structure, the image sensor assembly having sides; and
at least two flexible printed circuits, each having a first end and a second end and being electrically connected at the first end to the image sensor assembly,
wherein the flexible printed circuits fold around at least two of the sides of the image sensor assembly such that the second end of each of the at least two flexible circuits is at the same side of the image sensor assembly.

2. The actuator assembly of claim 1, wherein the image sensor assembly is suspended on the support structure in a manner allowing movement of the image sensor assembly relative to the support structure in any direction parallel to the plane in which the light-sensitive region extends and/or rotation of the image sensor assembly about any axis orthogonal to the plane in which the light-sensitive region extends.

3. The actuator assembly of claim 1, wherein each flexible printed circuit is folded around a corner extending along an axis orthogonal to the plane in which the light-sensitive region extends.

4. The actuator assembly of claim 1, wherein at least two of the flexible printed circuits are connected to different sides of the image sensor assembly.

5. The actuator assembly of claim 1, wherein each flexible printed circuit comprises a static section that includes said other end and is parallel to the plane of the image sensor assembly.

6. The actuator assembly of claim 5, wherein the static sections of at least two of the flexible printed circuits are adjacent to each other.

7. The actuator assembly of claim 1, wherein the flexible printed circuits comprise a power line for transferring electrical power to the image sensor assembly and/or a data lane for transferring data.

8. The actuator assembly of claim 7, wherein at least one of the data lanes comprises a meandering section such that the data lanes have substantially the same length as each other.

9. The actuator assembly of claim 1, wherein at least one of the flexible printed circuits comprises one or more terminals for connecting to one or more actuators.

10. The actuator assembly of claim 1, comprising:
plural shape memory alloy actuator wires in an arrangement capable, on selective driving thereof, of moving the image sensor assembly relative to the support structure in any direction laterally to the light-sensitive region and/or rotating the image sensor assembly about an axis orthogonal to the light-sensitive region.

11. The actuator assembly according to claim 1, comprising a multilayer flexible printed circuit, wherein the multilayer flexible printed circuit includes at least a first layer comprising one of the at least two flexible printed circuits and a second layer comprising another of the at least two flexible printed circuits.

12. The actuator assembly according to claim 1, wherein at least one of the flexible printed circuits comprises at least one split along a length of the flexible printed circuit, wherein the at least one split divides the length of flexible printed circuit into at least two parts.

13. The actuator assembly according to claim 5, wherein the static section of each of the at least two flexible printed circuits is connected to the image sensor via a moving section that is generally parallel to the plane of the image sensor assembly.

14. The actuator assembly according to claim 1, wherein the image sensor assembly comprises a printed circuit board, and wherein at least one of the flexible printed circuits is connected directly to the printed circuit board without being mechanically connected to any other component of the image sensor assembly.

15. A camera apparatus comprising:
the actuator assembly of claim 1; and
a lens assembly comprising at least one lens arranged to focus an image on the light-sensitive region, the lens assembly being mounted on the support structure.

16. The camera apparatus of claim 15, wherein at least most of the sections of the flexible printed circuits that fold around the image sensor assembly are between the image sensor assembly and the top of the lens assembly in the direction perpendicular to the plane of the image sensor assembly.

17. The camera apparatus of claim 15, wherein the lens assembly comprises:
   a lens carriage, on which the lens is supported in a manner allowing movement of the lens along its optical axis; and
   an autofocus actuator arrangement arranged to move the lens relative to the lens carriage along the optical axis.

18. The camera apparatus of claim 17, wherein the autofocus actuator arrangement is electrically connected to one or more terminals of the flexible printed circuits through the support structure.

19. The actuator assembly of claim 17, comprising at least one further flexible printed circuit folded around the image sensor assembly so as to electrically connect the autofocus actuator arrangement to one or more terminals of said flexible printed circuits.

20. The camera apparatus of claim 15, wherein the lens assembly comprises a lens actuator arrangement arranged to move the lens perpendicular to the optical axis.

\* \* \* \* \*